(12) United States Patent
Park et al.

(10) Patent No.: US 11,068,096 B2
(45) Date of Patent: Jul. 20, 2021

(54) DISPLAY DEVICE

(71) Applicant: Samsung Display Co., Ltd., Yongin-si (KR)

(72) Inventors: Hyung Jun Park, Seongnam-si (KR); Jun Yong An, Asan-si (KR); Nu Ree Um, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/829,901

(22) Filed: Mar. 25, 2020

(65) Prior Publication Data

US 2021/0019007 A1 Jan. 21, 2021

(30) Foreign Application Priority Data

Jul. 18, 2019 (KR) .......................... 10-2019-0087160

(51) Int. Cl.
*G06F 3/041* (2006.01)
*G06F 3/047* (2006.01)

(52) U.S. Cl.
CPC ............ *G06F 3/0412* (2013.01); *G06F 3/047* (2013.01); *G06F 2203/04103* (2013.01); *G06F 2203/04111* (2013.01)

(58) Field of Classification Search
CPC ........... G06F 3/047; G06F 2203/04111; G06F 3/0412; G06F 3/0445; G06F 3/04164;

(Continued)

(56) References Cited

U.S. PATENT DOCUMENTS 8,711,570 B2\* 4/2014 Hotelling .............. G06F 1/1643 361/749
2010/0085326 A1\* 4/2010 Anno ................. H03K 17/9622 345/174

(Continued)

FOREIGN PATENT DOCUMENTS

CN 105975129 B 8/2018
KR 10-2016-0084941 A 7/2016

(Continued)

OTHER PUBLICATIONS

EPO Extended European Search Report dated Dec. 3, 2020, issued in corresponding European Patent Application No. 20182628.6 (7 pages).

Primary Examiner — Sanjiv D. Patel
(74) Attorney, Agent, or Firm — Lewis Roca Rothgerber Christie LLP

(57) ABSTRACT

A display device includes: a base substrate having a main region, a subsidiary region, and a bending region between the main region and the subsidiary region; first to fourth touch electrodes on the base substrate at the main region; first to fourth touch signal lines connected to the first to fourth touch electrodes; a first bridge electrode connecting the first and second touch signal lines; a second bridge electrode connecting the third and fourth touch signal lines; and a third bridge electrode connecting a first touch connection electrode connected to the first bridge electrode with a second touch connection electrode connected to the second bridge electrode. The subsidiary region includes a first bridge portion and a second bridge portion. Each of the first bridge electrode and the second bridge electrode is at the first bridge portion, and the third bridge electrode is at the second bridge portion.

22 Claims, 21 Drawing Sheets

(58) Field of Classification Search
CPC ......... G06F 2203/04102; G06F 3/0446; G06F
3/044; G06F 3/041; G02F 1/136213;
H01L 27/3276; H01L 27/3265; H01L
27/1255; H01L 27/3262; H01L 29/42384;
H01L 27/1251; H01L 27/3258
See application file for complete search history.

(56) References Cited

U.S. PATENT DOCUMENTS

| | | |
|---|---|---|
| 2010/0214247 A1* | 8/2010 | Tang .................. G06F 3/0443 345/173 |
| 2011/0279408 A1 | 11/2011 | Urano et al. |
| 2014/0118277 A1 | 5/2014 | Kim et al. |
| 2016/0110008 A1 | 4/2016 | Lee et al. |
| 2017/0262109 A1* | 9/2017 | Choi ...................... H01L 51/56 |
| 2017/0344147 A1 | 11/2017 | Weng et al. |
| 2018/0033833 A1* | 2/2018 | An ...................... G06F 3/0412 |
| 2018/0095574 A1 | 4/2018 | Kim et al. |
| 2018/0138259 A1* | 5/2018 | Kim ................... H01L 27/3279 |
| 2018/0284926 A1 | 10/2018 | Kim et al. |
| 2018/0308903 A1* | 10/2018 | Jeong ................. H01L 27/3276 |
| 2018/0373359 A1 | 12/2018 | Han et al. |
| 2019/0018541 A1 | 1/2019 | Han et al. |
| 2019/0019441 A1 | 1/2019 | Shin et al. |
| 2019/0095007 A1* | 3/2019 | Jeong ................... G06F 3/0446 |
| 2019/0165048 A1 | 5/2019 | Kim et al. |
| 2020/0293130 A1 | 9/2020 | Ahn |

FOREIGN PATENT DOCUMENTS

| | | |
|---|---|---|
| KR | 10-2016-0095594 A | 8/2016 |
| KR | 10-2019-0000026 A | 1/2019 |
| KR | 10-2019-0063497 A | 6/2019 |

\* cited by examiner

DISPLAY DEVICE

CROSS-REFERENCE TO RELATED APPLICATION

This application claims priority to and the benefit of Korean Patent Application No. 10-2019-0087160, filed on Jul. 18, 2019 in the Korean Intellectual Property Office, the disclosure of which is incorporated herein by reference in its entirety.

BACKGROUND

1. Field

Aspects of one or more exemplary embodiments of the invention relate to a display device.

2. Description of the Related Art

Electronic devices that provide images to a user, for example, such as a smart phone, a tablet PC, a digital camera, a laptop computer, a navigation device, and a smart TV include a display device for displaying the images. Such a display device includes a display panel for generating and displaying an image, and various input devices for receiving an input.

Recently, a touch member that can detect a touch input is employed in a display device for smart phones, tablet PCs, and/or the like. Such a touch member is formed directly on a display panel in order to simplify a manufacturing process of the display device, and to reduce the thickness of the display device. Accordingly, in order to reduce a number of masks that are used for forming touch electrodes of the touch member, research is ongoing.

The above information disclosed in this Background section is for enhancement of understanding of the background of the invention, and therefore, it may contain information that does not constitute prior art.

SUMMARY

Research is ongoing to form touch electrodes using a single conductive layer in order to reduce a number of masks that are used for forming touch electrodes of the touch member.

One or more exemplary embodiments of the invention are directed to a display device in which a number of pads of a touch member is reduced.

According to an embodiment, a display device includes: a base substrate having a main region, a subsidiary region, and a bending region between the main region and the subsidiary region; first, second, third, and fourth touch electrodes on the base substrate at the main region; first, second, third, and fourth touch signal lines connected to the first, second, third, and fourth touch electrodes on the base substrate; a first bridge electrode electrically connecting the first touch signal line with the second touch signal line; a second bridge electrode electrically connecting the third touch signal line with the fourth touch signal line; a first touch connection electrode electrically connected to the first bridge electrode; a second touch connection electrode electrically connected to the second bridge electrode; and a third bridge electrode connecting the first touch connection electrode with the second touch connection electrode. The subsidiary region includes a first bridge portion, and a second bridge portion that is located farther from the main region than the first bridge portion in a first direction. Each of the first bridge electrode and the second bridge electrode is at the first bridge portion, and the third bridge electrode is at the second bridge portion.

In an embodiment, the subsidiary region may further include a pad portion including a pad, the pad portion may be located farther from the main region than the second bridge portion in the first direction, and a third touch connection electrode may be connected to the third bridge electrode and to the pad.

In an embodiment, the first touch signal line may include: the first touch connection electrode at the main region; a source connection electrode at the bending region and the first bridge portion; and the second touch connection electrode at the second bridge portion and on a same layer as that of the first touch connection electrode. The first touch connection electrode and the second touch connection electrode may be at a different layer from that of the source connection electrode.

In an embodiment, the first touch connection electrode may be connected to the source connection electrode through a first contact hole, the second touch connection electrode may be connected to the source connection electrode through a second contact hole, and the first contact hole may be closer to the main region than the second contact hole in a second direction opposite to the first direction.

In an embodiment, the source connection electrode may be connected to the first bridge electrode through a third contact hole at the first bridge portion, and the third contact hole may be farther from the main region than the first contact hole in the first direction, and may be closer to the main region than the second contact hole in the second direction.

In an embodiment, the second touch connection electrode may be connected to the third bridge electrode through a fourth contact hole at the second bridge portion, and the fourth contact hole may be farther from the main region than the second contact hole in the first direction.

In an embodiment, the first touch electrode to the fourth touch electrode may be driving electrodes, and the first touch signal line to the fourth touch signal line may be driving touch signal lines configured to provide driving signals to the driving electrodes.

In an embodiment, the first touch electrode to the fourth touch electrode may be sensing electrodes, and the first touch signal line to the fourth touch signal line may be touch sensing signal lines configured to transmit sensing signals from the sensing electrodes.

In an embodiment, the first bridge electrode and the second bridge electrode may overlap with each other in a thickness direction that crosses the first direction, and the first bridge electrode and the second bridge electrode may be disposed at different layers from each other.

In an embodiment, the display device may further include: a driving integrated circuit at the subsidiary region on the base substrate; and a supply voltage line connected to the driving integrated circuit. The first bridge portion may include: a first sub-bridge portion; and a second sub-bridge portion spaced from the first sub-bridge portion with the supply voltage line between the first and second sub-bridge portions.

In an embodiment, the first touch signal line and the second touch signal line may be at the first sub-bridge portion, the third touch signal line and the fourth touch signal line may be at the second sub-bridge portion, and the second touch connection electrode may overlap with the supply voltage line in a thickness direction that crosses the first direction.

In an embodiment, the display device may further include: a fifth touch electrode; a sixth touch electrode; a fifth touch signal line connected to the fifth touch electrode; and a sixth touch signal line connected to the sixth touch electrode. The first touch signal line to the fourth touch signal line may be at the first sub-bridge portion, the fifth touch signal line and the sixth touch signal line may be at the second sub-bridge portion, and the display device may further include a fourth bridge electrode electrically connecting the fifth touch signal line with the sixth touch signal line at the second sub-bridge portion.

In an embodiment, the display device may further include a third touch connection electrode connected to the fourth bridge electrode, and the third touch connection electrode may be directly connected to the second touch connection electrode at the first bridge portion.

In an embodiment, the display device may further include: a seventh touch electrode; an eighth touch electrode; a seventh touch signal line electrically connected to the seventh touch electrode; and an eighth touch signal line electrically connected to the eighth touch electrode. The seventh touch signal line and the eighth touch signal line may be at the second sub-bridge portion, and the display device may further include a fifth bridge electrode electrically connecting the seventh touch signal line with the eighth touch signal line at the second sub-bridge portion.

In an embodiment, the display device may further include: a third touch connection electrode electrically connected to the fourth bridge electrode; a fourth touch connection electrode electrically connected to the fifth bridge electrode; and a fifth touch connection electrode electrically connected to a sixth bridge electrode. The third touch connection electrode and the fourth touch connection electrode may be electrically connected to each other through the sixth bridge electrode at the second bridge portion, and the fifth touch connection electrode and the third touch connection electrode may be electrically connected to each other through a seventh bridge electrode.

In an embodiment, the first bridge portion may further include a third sub-bridge portion between connection parts of the supply voltage line.

According to an embodiment, a display device includes: a base substrate having a main region, a subsidiary region, and a bending region between the main region and the subsidiary region; a first conductive layer on the base substrate; a first insulating layer on the first conductive layer; a second conductive layer on the first insulating layer; a second insulating layer on the second conductive layer; a third conductive layer on the second insulating layer; a third insulating layer on the third conductive layer; a fourth conductive layer on the third insulating layer, the fourth conductive layer including: first, second, third, and fourth touch electrodes at the main region; and first, second, third, and fourth touch signal lines electrically connected to the first, second, third, and fourth touch electrodes; a first touch connection electrode electrically connected to a first bridge electrode; and a second touch connection electrode electrically connected to a second bridge electrode. The first conductive layer or the second conductive layer includes: the first bridge electrode electrically connecting the first touch signal line with the second touch signal line; the second bridge electrode electrically connecting the third touch signal line with the fourth touch signal line; and a third bridge electrode electrically connecting the first touch connection electrode with the second touch connection electrode.

In an embodiment, the subsidiary region may include a first bridge portion and a second bridge portion, the second bridge portion being farther from the main region than the first bridge portion in a first direction, the first bridge electrode and the second bridge electrode may be at the first bridge portion, and the third bridge electrode may be at the second bridge portion.

In an embodiment, the first touch signal line may include: the first touch connection electrode at the main region; a source connection electrode at each of the bending region and the first bridge portion; and the second touch connection electrode at the second bridge portion, the second touch connection electrode being at a same layer as that of the first touch connection electrode, and the first touch connection electrode and the second touch connection electrode may be at a different layer from that of the source connection electrode.

In an embodiment, the fourth conductive layer may further include the first touch connection electrode and the second touch connection electrode, and the third conductive layer may further include the source connection electrode.

In an embodiment, the display device may further include an encapsulation layer on the third conductive layer and the third insulating layer, and the third insulating layer may be directly on the encapsulation layer.

In an embodiment, the first bridge electrode and the second bridge electrode may overlap with each other in a thickness direction, and the first bridge electrode and the second bridge electrode may be at different layers from each other.

According to one or more exemplary embodiments, a display device includes a plurality of touch signal lines and a plurality of touch electrodes that are electrically connected (e.g., electrically merged or electrically linked) to each other through bridge electrodes that are arranged (e.g., or extend) in a direction that crosses a direction in which the touch signal lines extend to a pad. Accordingly, a number of touch pads may be reduced. As a result, a sufficient area where the driving integrated circuit is to be mounted on the display panel may be provided. In addition, a dead space may be reduced in the touch pad unit.

It should be noted, however, that the aspects and features of the present disclosure are not limited to those described above, and that other aspects and features of the present disclosure may become apparent to those skilled in the art from the following description.

BRIEF DESCRIPTION OF THE DRAWINGS

The above and other aspects and features of the present disclosure will become more apparent to those skilled in the art from the following detailed description of the exemplary embodiments with reference to the attached drawings.

DETAILED DESCRIPTION

Figure 1:
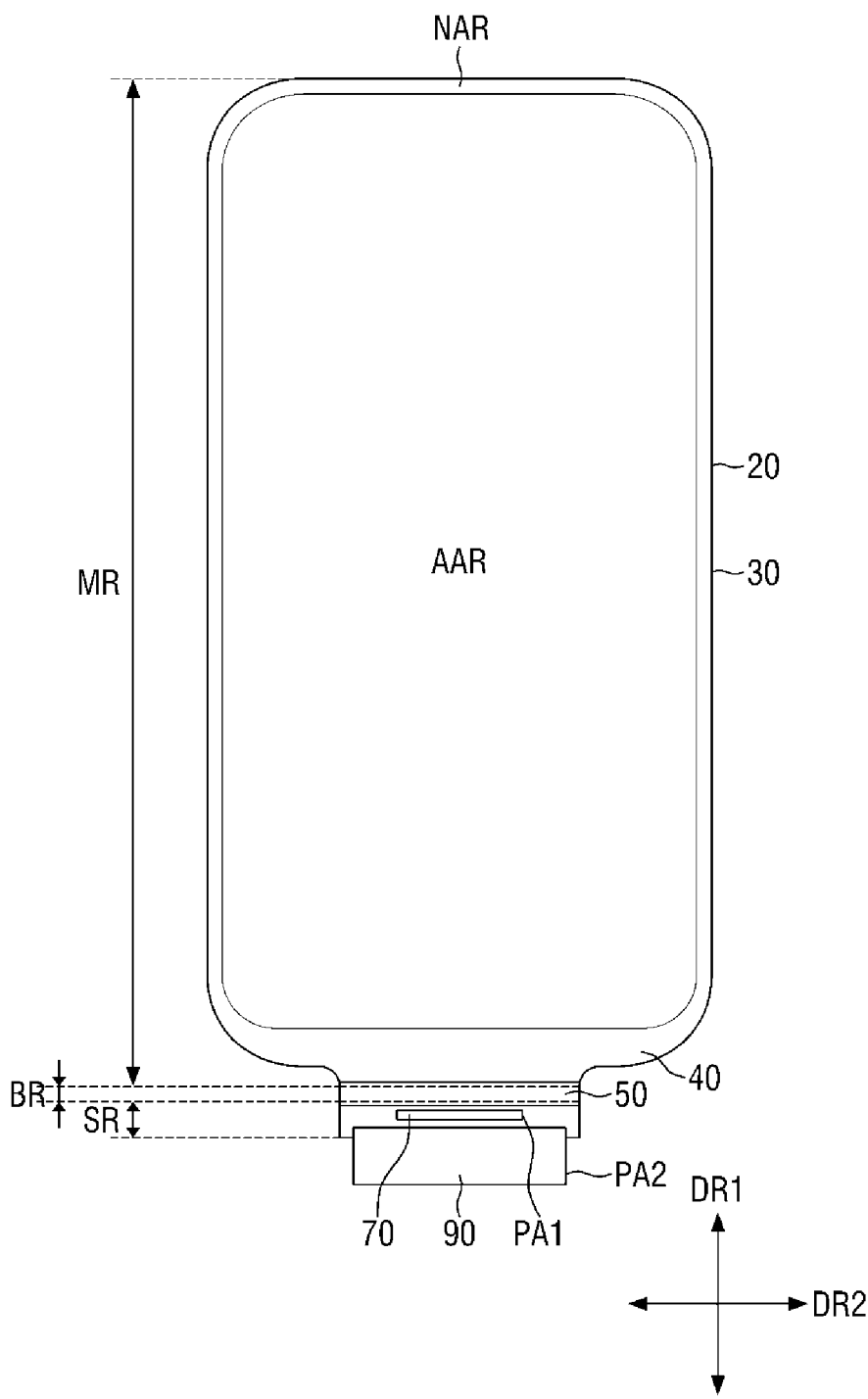
FIG. 1 is a plan view showing a layout of a display device according to an exemplary embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity.

Spatially relative terms, such as "beneath," "below," "lower," "under," "bottom," "above," "upper," "top," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Exemplary embodiments are described herein with reference to various cross section illustrations corresponding to schematic illustrations of the exemplary embodiments. As such, variations in the shapes shown in the illustrations resulting from, for example, manufacturing techniques and/or tolerances are to be expected. Thus, embodiments described herein should not be construed as being limited to the particular shapes of the elements, layers, and regions as illustrated in the figures, but are to include variations and deviations in the shapes resulting from, for example, manufacturing processes. For example, a region illustrated or described as flat may typically have rough and/or nonlinear features. Moreover, sharp angles that are illustrated in the figures may be rounded. Thus, the elements, layers, and regions illustrated in the figures are schematic in nature, and the figures are not intended to illustrate the precise shapes of the elements, layers, and regions, such that they are not intended to limit the spirit and scope of the invention.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. On the other hand, it should be understood that when an element is referred to as being "directly on," "directly coupled to," or "directly connected to" another element or layer, there are no intervening elements or layers present. Other expressions that describe the relationships between elements or layers, such as "directly between," "adjacent to," or "directly adjacent to," should be construed in the same or substantially the same manner.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "or" refers to "and/or," and the term "and/or" includes any and all combinations of one or more of the associated listed items. Expressions such as "at least one of," when preceding a list of elements, modify the entire list of elements and do not modify the individual elements of the list.

As used herein, the term "substantially," "about," "approximately," and similar terms are used as terms of approximation and not as terms of degree, and are intended to account for the inherent variations in measured or calculated values that would be recognized by those of ordinary skill in the art. For example, the terms "about," "approximately," and similar terms as used herein is inclusive of the stated value and refers to an acceptable range of deviation for the particular value as determined by one of ordinary skill in the art, considering the measurement in question and the error associated with the measurement of the particular quantity (e.g., the limitations of the measurement system). For example, "about" may refer to within one or more standard deviations, or within ±30%, 20%, 10% or 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments of the invention will be described in more detail with reference to the attached drawings.

Figure 2:
FIG. 2 is a cross-sectional view of a display device in a bent state according to an exemplary embodiment of the present disclosure.
Figure 3:
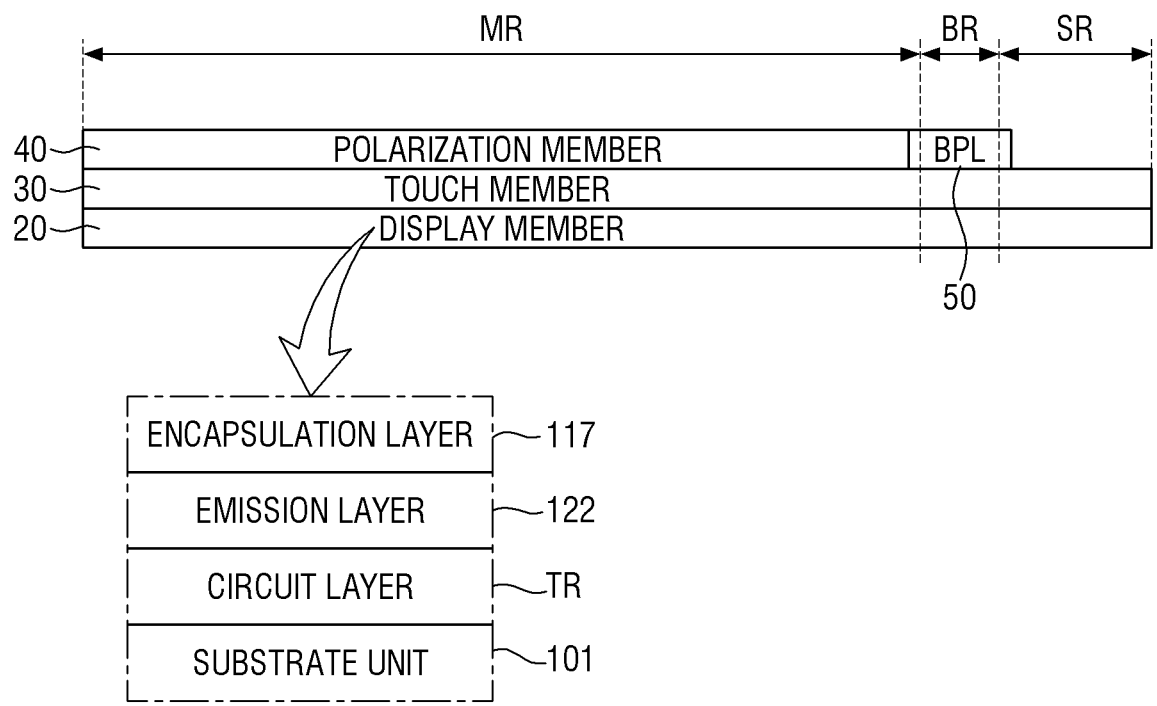
FIG. 3 is a cross-sectional view of a display device according to an exemplary embodiment of the present disclosure.

FIG. 1 is a plan view showing a layout of a display device according to an exemplary embodiment of the present disclosure. FIG. 2 is a cross-sectional view showing a part of a display device in a bent state according to an exemplary embodiment of the present disclosure. FIG. 3 is a cross-sectional view of a display device according to an exemplary embodiment of the present disclosure.

As shown in FIG. 1, a first direction DR1 may cross a second direction DR2. In the plan view (e.g., a view from a plane that is parallel or substantially parallel (or from a direction normal) to a surface of the display device) of FIG. 1, the first direction DR1 is shown as a vertical direction and the second direction DR2 is shown as a horizontal direction for convenience of illustration. Accordingly, for convenience of illustration, in the following description, an upper arrow pointing upwards in the first direction DR1 indicates an upper side, a lower arrow pointing downwards in the first direction DR1 indicates a lower side, a right arrow pointing towards the right in the second direction DR2 indicates a right side, and a left arrow pointing towards the left in the second direction DR2 indicates a left side when viewed from a top plan view (e.g., a view from a plane that is parallel or substantially parallel (or from a direction normal) to a top surface of the display device). However, the invention is not limited to the directions shown in the figures, and it should be understood that the directions that are referred to with respect to the exemplary embodiments are relative directions, and that the invention is not limited to the directions described herein.

Referring to FIGS. 1 to 3, a display device 1 may be a display device for any suitable electronic device that provides a display screen as would be understood by those skilled in the art. For example, the display device 1 may be included in any suitable portable or non-portable electronic device for providing a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console, a digital camera, a television set, a laptop computer, a monitor, an electronic billboard, an Internet of Things (IoT) device, and/or the like.

The display device 1 includes an active area AAR and a non-active area NAR. A display area of the display device 1 may be defined as an area where images are displayed, and a non-display area of the display device 1 may be defined as an area where no image is displayed. In addition, a touch area of the display device 1 may be defined as an area where a touch input is sensed. Accordingly, the active area AAR may include the display area and the touch area. The display area and the touch area may overlap with each other at (e.g., in or on) the active area AAR. As a result, images may be displayed at the active area AAR and a touch input may be sensed at the active area AAR.

The active area AAR may have a shape corresponding to a rectangle with angled corners or a rectangle with rounded corners. For example, in FIG. 1, the active area AAR is shown to have a shape corresponding to a rectangle with rounded corners having sides that extend in the first direction DR1 that are longer than sides that extend in the second direction DR2. However, the present disclosure is not limited thereto, and the active area AAR may have various suitable shapes, for example, such as a rectangular shape having angled corners having sides that extend in the first direction DR1 that are longer than sides that extend in the second direction DR2, a rectangular shape (e.g., with angled corners or rounded corners) having sides that extend in the second direction DR2 that are longer than sides that extend in the first direction DR1, a square shape, other suitable polygonal shapes, a circular shape, an elliptical shape, and/or the like.

The non-active area NAR is disposed around the active area AAR. The non-active area NAR may define (e.g., may be) a bezel area. The non-active area NAR may surround all sides (e.g., four sides in FIG. 1) of the active area AAR. For example, the non-active area NAR may surround a periphery of the active area AAR. However, the present disclosure is not limited thereto. For example, the non-active area NAR may not be disposed adjacent to the upper side of the active area AAR, or may not be disposed adjacent to the left side and/or the right side of the active area AAR. In other words, in some embodiments, the non-active area NAR may partially surround the periphery of the active area AAR.

Signal lines for applying signals to the active area AAR (e.g., the display area and/or the touch area) and/or driving circuits of the display device 1 may be disposed at (e.g., in or on) the non-active area NAR. The non-active area NAR may not include a display area. Further, in some embodiments, the non-active area NAR may not include a touch area. In another exemplary embodiment, the non-active area NAR may include a part (or a portion) of the touch area, and a sensor member, for example, such as a pressure sensor, may be disposed in the part of the touch area that is included in the non-active area NAR. In some exemplary embodiments, the active area AAR may correspond to (e.g., may be identical to or substantially the same as) the display area where images are displayed, and the non-active area NAR may correspond to (e.g., may be identical to or substantially the same as) the non-display area where no image is displayed. In other words, in some exemplary embodiments, the active area AAR may define the display area where the images are displayed, and the non-active area NAR may define the non-display area where no image is displayed.

The display device 1 includes a display panel 10 for providing a display screen. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, and/or the like. Hereinafter, an organic light-emitting display panel is provided as an example of the display panel 10 for convenience of description, but the present disclosure is not limited thereto, and any other suitable display panel may be provided as the display panel 10 as would be understood by those having ordinary skill in the art.

The display device 1 may further include a touch member for sensing a touch input. The touch member may be provided as a separate panel or a separate film from the display panel 10 and may be connected to (e.g., attached on) the display panel 10, or the touch member may be provided in the form of a touch layer in (e.g., within or inside) the display panel 10. In the following description, the touch member is described as being disposed in (e.g., within or inside) the display panel 10 to be a part of (e.g., included in) the display panel 10, for convenience of description, but the present disclosure is not limited thereto.

The display panel 10 may include a flexible substrate including a flexible polymer material, for example, such as polyimide. Accordingly, the display panel 10 may be curved, bent, folded, and/or rolled.

The display panel 10 may include a bending region BR. The display panel 10 may be divided into a main region MR that is located on one side of the bending region BR and a subsidiary region SR that is located on another side of the bending region BR. In other words, the main region MR may be defined at one end of the display panel 10 relative to the bending region BR, and the subsidiary region SR may be defined at another end of the display panel 10 relative to the bending region BR.

The display area of the display panel 10 is located at (e.g., in or on) the main region MR. The display area includes a plurality of pixels. According to an exemplary embodiment of the present disclosure, edge portions of the display area at (e.g., in or on) the main region MR, an entirety of the bending region BR, and an entirety of the subsidiary region SR may define (e.g., may be) the non-display area. However, the present disclosure is not limited thereto. For example, in some embodiments, the bending region BR and/or the subsidiary region SR may also include the display area (or a portion of the display area).

The main region MR may have a shape that is the same or substantially the same as (e.g., or generally similar to) an appearance of the display device 1 when viewed from a top plan view (e.g., a view from a plane that is parallel or substantially parallel (or in a direction normal) to a top surface of the display device). The main region MR may be a flat region located in one plane. However, the present disclosure is not limited thereto. For example, at least one of the edges (e.g., sides) of the main region MR, except for the edge (e.g., side) that is connected to the bending region BR, may be bent to form a curved surface or may be bent at a right angle.

When at least one of the edges of the main region MR is curved or bent (e.g., except for the edge (side) connected to the bending region BR), the display area (e.g., a portion of the display area) may be disposed at the at least one of the edges. However, the present disclosure is not limited thereto. For example, the curved or bent edge may be at the non-display area that does not display an image, or the display area and the non-display area may be disposed together.

The bending region BR is connected to one side of the main region MR in the first direction DR1. For example, the bending region BR may be connected to a lower side (e.g., a lower shorter side) of the main region MR. The width of the bending region BR may be less than the width (e.g., the width of the lower shorter side) of the main region MR. The portions where the main region MR is connected to (or meets) the bending region BR may be cut in an L-shape to define a recessed portion.

The display panel 10 may be bent downward in a thickness direction (e.g., in a direction facing away from the display surface) with a curvature at (e.g., in or on) the bending region BR. While FIG. 2 shows that the display panel 10 may have a constant radius of curvature at the bending region BR, the present disclosure is not limited thereto. For example, the display panel 10 may have different radii of curvature for different sections. As the display panel 10 is bent at the bending region BR, a surface of the display panel 10 may be reversed. For example, the surface of the display panel 10 that faces upwards may be bent such that the surface faces outwardly (e.g., towards a side) at the bending region BR and then faces downwardly (e.g., at the subsidiary region SR).

The subsidiary region SR extends from a side of the bending region BR. For example, in some embodiments, the subsidiary region SR may extend from an opposite side of the bending region BR from that of the main region MR. The subsidiary region SR may extend in a direction that is parallel to or substantially parallel to a surface of the main region MR after the display device is bent. The subsidiary region SR may overlap with the main region MR in the thickness direction of the display panel 10. The width of the subsidiary region SR (e.g., the width in the second direction DR2) may be equal to or substantially equal to the width of the bending region BR, but the present disclosure is not limited thereto.

The subsidiary region SR may include a first pad area PA1 and a second pad area PA2 that is located farther from the bending region BR than the first pad area PA1 as shown in the plan view of FIG. 1. For example, the first pad area PA1 may be disposed between the bending region BR and the second pad area PA2, such that the first pad area PA1 is more adjacent to the bending region BR than the second pad area PA2. A driving chip 70 may be disposed at (e.g., in or on) the first pad area PA1 of the subsidiary region SR. The driving chip 70 may include an integrated circuit for driving the display panel 10. The integrated circuit may include an integrated circuit for displaying an image and/or an integrated circuit for a touch unit (e.g., a touch sensor). The integrated circuit for displaying the image and the integrated circuit for the touch unit may be provided as separate chips or may be integrated into a single chip.

A plurality of display signal line pads and a plurality of touch signal line pads may be disposed at (e.g., in or on) the second pad area PA2 of the subsidiary region SR of the display panel 10. A driving board 90 may be connected to the second pad area PA2 of the subsidiary region SR of the display panel 10. The driving board 90 may be a flexible printed circuit board or a film (e.g., a flexible film).

Referring to FIG. 3, the display panel 10 may include a display member 20, a touch member 30, a polarization member 40, and a bending protective layer (BPL) 50. The display member 20 may be disposed at each of (e.g., across) the main region MR, the bending region BR, and the subsidiary region SR. For example, the display member 20 may overlap with each of the main region MR, the bending region BR, and the subsidiary region SR. As shown in the enlarged cross-sectional view of FIG. 3, the display member 20 includes a substrate unit (e.g., a substrate) 101, a circuit layer (e.g., a thin-film transistor) TR disposed on the substrate unit 101, an emission layer (e.g., a light-emitting layer) 122 disposed on the circuit layer TR, and an encapsulation layer (or an encapsulating layer) 117 disposed on the emission layer 122 (e.g., see FIG. 4). The display member 20 may further include a first electrode 121 disposed under the emission layer 122, and a second electrode 123 disposed on the emission layer 122 (e.g., see FIG. 4). The first electrode 121, the emission layer 122, and the second electrode 123 may form a light-emitting element. The light-emitting element may be disposed at (e.g., in or on) each of the pixels.

The shape of the display member 20 may be the same or substantially the same as (e.g., identical or substantially identical to) the shape of the display panel 10 when viewed from the top plan view as described above. In other words, the display member 20 may have a shape that is the same or substantially the same as (e.g., substantially identical to) the shape (e.g., a collective shape) of the main region MR, the bending region BR, and the subsidiary region SR when viewed from the top plan view.

The touch member 30 may be disposed on the display member 20. The touch member 30 may be disposed at each of (e.g., across) the main region MR, the bending region BR, and the subsidiary region SR. The touch member 30 may be formed on (e.g., directly on) the display member 20. The touch member 30 may include a touch insulating layer, and a touch conductive layer disposed on the touch insulating layer.

The polarization member 40 may be disposed on the main region MR of the touch member 30, and the bending protective layer 50 may be disposed on the bending region BR of the touch member 30.

The shape of the touch member 30 may be the same or substantially the same as (e.g., identical or substantially identical to) the shape of the display member 20 when viewed from the top plan view. In other words, the touch member 30 may have a shape that is the same or substantially the same as (e.g., substantially identical to) the shape (e.g., the collective shape) of the main region MR, the bending region BR, and the subsidiary region SR when viewed from the top plan view.

As shown in FIG. 3, the polarizing member 40 may generally overlap with the main region MR in the thickness direction, and may not overlap with (e.g., may not be disposed in) the bending region BR. The bending protective layer 50 may overlap with (e.g., entirely overlap with) the bending region BR, and may have portions that overlap with (e.g., may be expanded to) a part (or portion) of each of the main region MR and the subsidiary region SR that are adjacent to the bending region BR. A side surface of the polarizing member 40 may be in contact with a side surface of the bending protective layer 50. In other words, there may be no spacing (or no gap) between the side surface of the polarizing member 40 and the side surface of the bending protective layer 50. A boundary between the side surface of the bending protective layer 50 and the side surface of the polarizing member 40 may be located at (e.g., in or on) the main region MR.

Referring again to FIG. 1, the shape of the polarizing member 40 may be the same or substantially the same as (e.g., identical or substantially identical to) a shape of a portion of the touch member 30 that overlaps with the main region MR as described above when viewed from the top plan view. In some exemplary embodiments, the polarizing member 40 may be smaller than the touch member 30 when viewed from the top plan view, so that a part (or a portion) of an edge of the portion of the touch member 30 that overlaps with the main region MR may be exposed.

The shape of the bending protective layer 50 may be the same or substantially the same as (e.g., identical or substantially identical to) the shape of the portion of the touch member 30 that overlaps with the bending region BR as described above when viewed from the top plan view. The shape of the bending protective layer 50 when viewed from the top plan view may be rectangular or substantially rectangular. In some exemplary embodiments, the bending protective layer 50 may be smaller than the touch member 30 when viewed from the top plan view. For example, the width of the bending protective layer 50 in the second direction DR2 may be less than the width of the touch member 30 in the second direction DR2.

Figure 4:
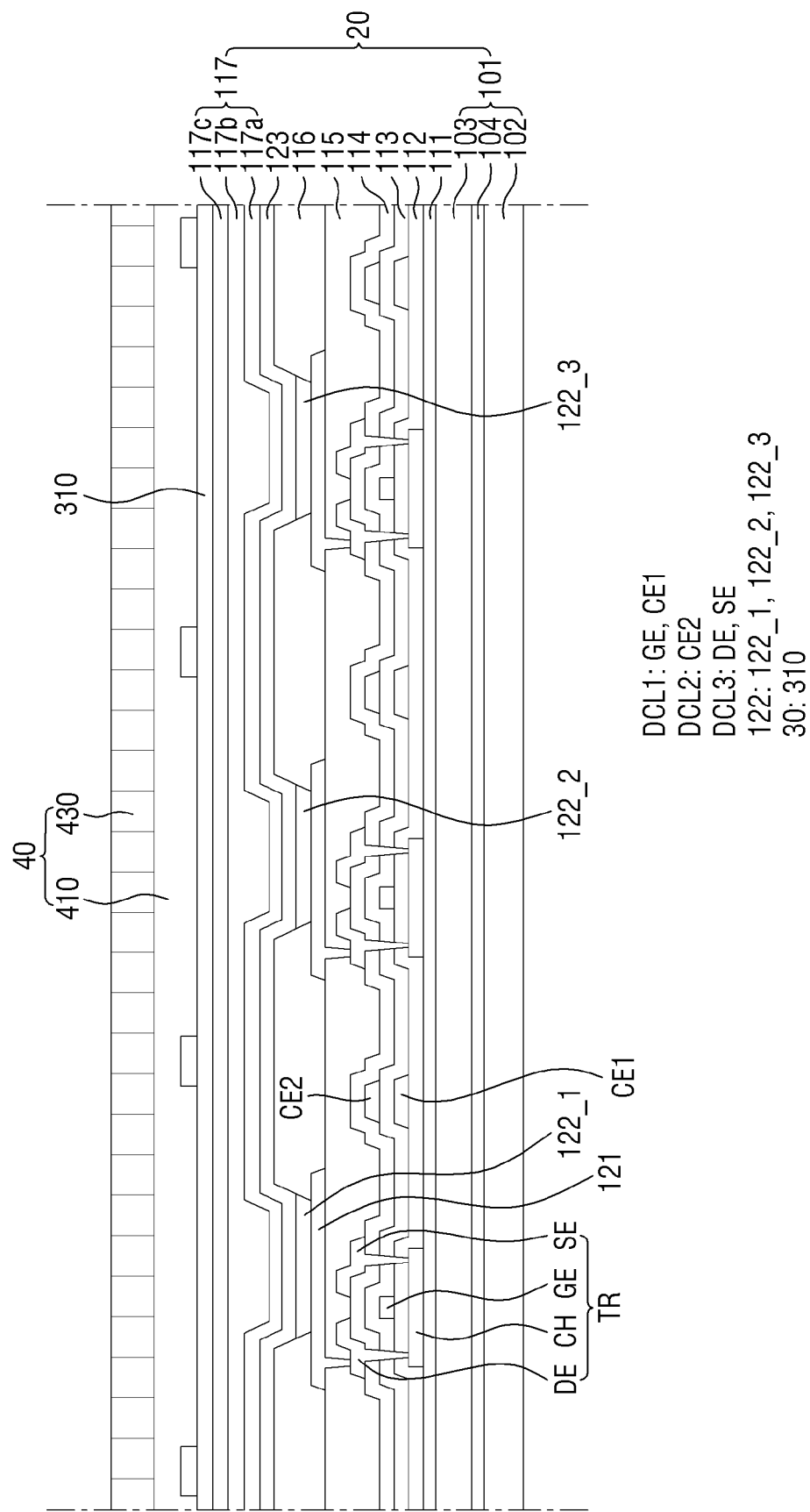
FIG. 4 is a cross-sectional view of a main region of a display device according to an exemplary embodiment of the present disclosure.
Figure 5:
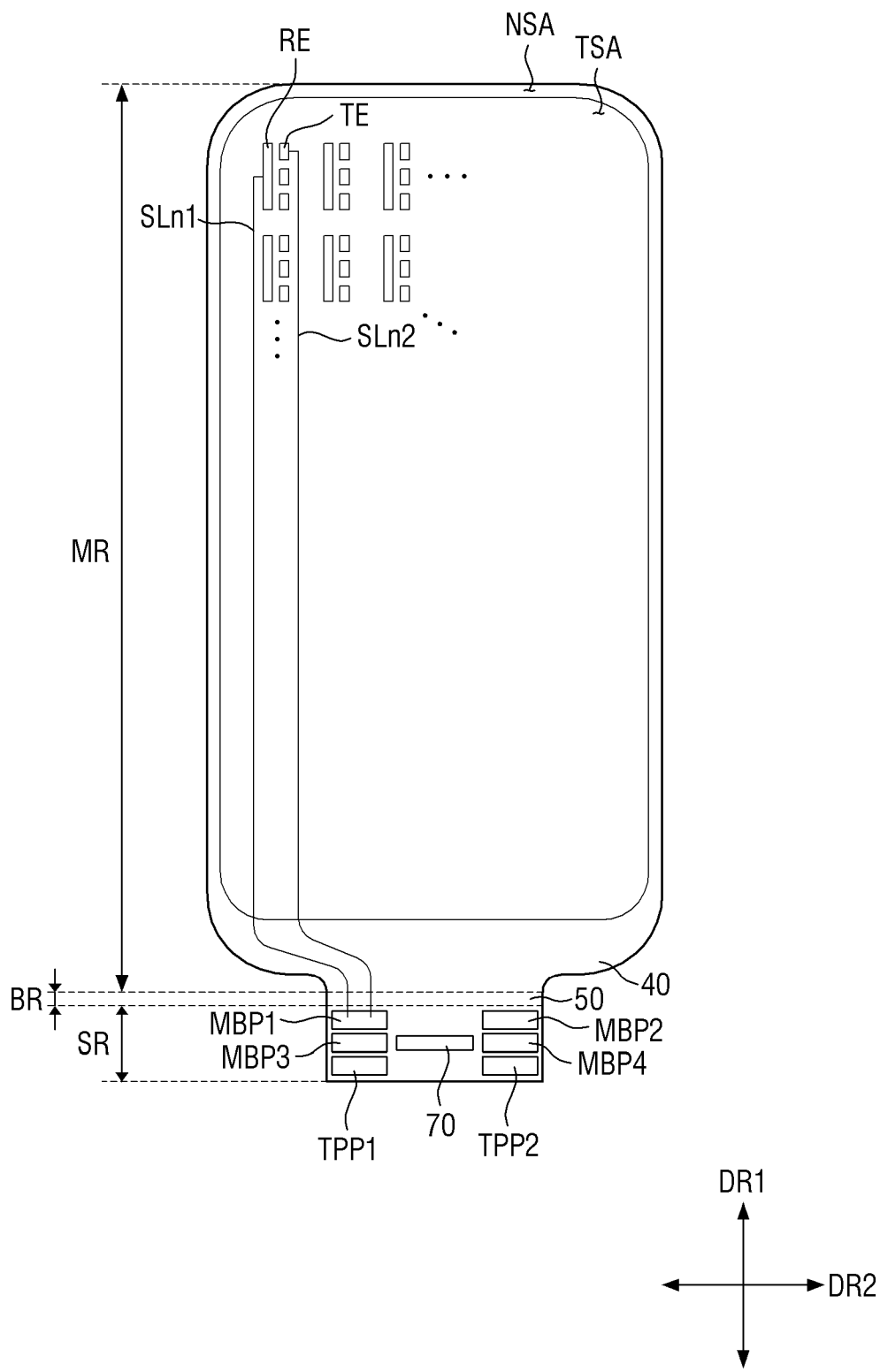
FIG. 5 is a plan view showing a layout of a display member and a touch member of a display device according to an exemplary embodiment of the present disclosure.
Figure 6:
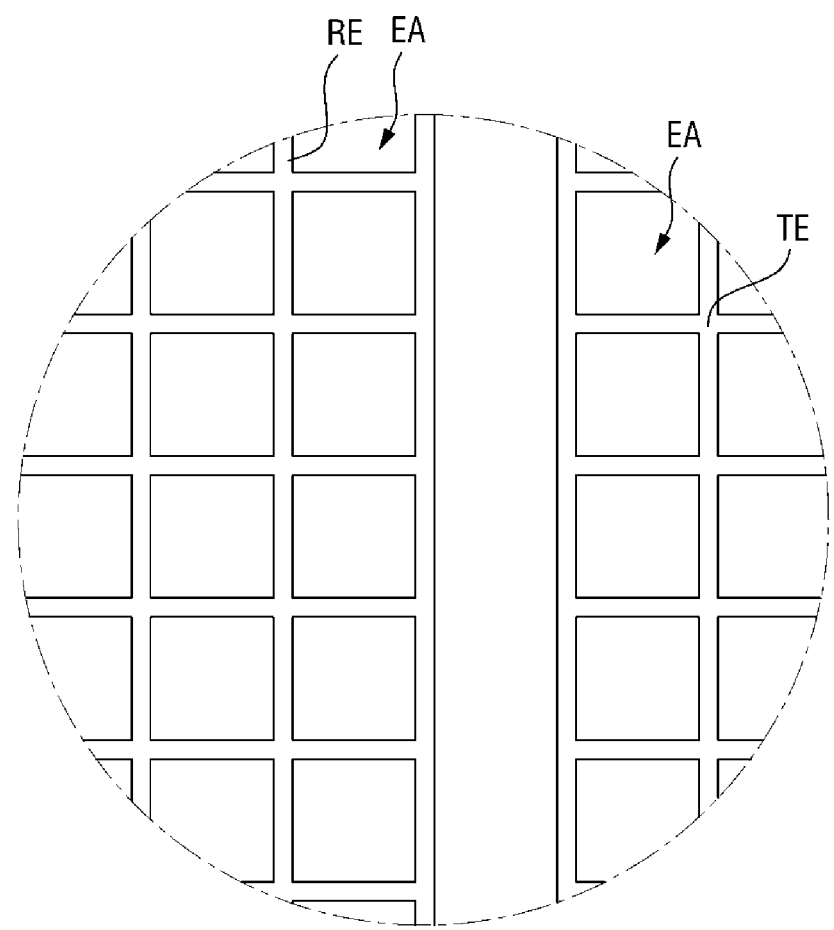
FIG. 6 is an enlarged plan view of sensing electrodes and driving electrodes according to an exemplary embodiment of the present disclosure.

FIG. 4 is a cross-sectional view of a main region of a display device according to an exemplary embodiment of the present disclosure. FIG. 5 is a plan view showing a layout of a display member and a touch member of a display device according to an exemplary embodiment of the present disclosure. FIG. 6 is an enlarged plan view of sensing electrodes and driving electrodes.

Referring to FIGS. 4 to 6, the substrate unit 101 may include a first support substrate 102, a second support substrate 103 disposed on the first support substrate 102, and a barrier layer 104 disposed between the first support substrate 102 and the second support substrate 103. Each of the first support substrate 102 and the second support substrate 103 may be a flexible substrate as described above. For example, each of the first support substrate 102 and the second support substrate 103 may be a film substrate or a plastic substrate including (e.g., containing) a polymer organic material. For example, the first support substrate 102 and the second support substrate 103 may include (e.g., or may be formed of) a material selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In addition, the substrate unit 101 may include fiber glass reinforced plastic (FRP).

The barrier layer 104 may be disposed between the first support substrate 102 and the second support substrate 103, and may connect the first support substrate to the second support substrate 103. The barrier layer 103 may provide a flat surface for (e.g., or may flatten or planarize a surface of each of) the first and second support substrates 102 and 103 that include an organic material. The barrier layer 104 may include (or may be made of) an inorganic material.

A buffer layer 111 is disposed on the substrate unit 101. For example, the buffer layer 111 may be disposed on the second support substrate 103. The buffer layer 111 may provide a smooth surface for (e.g., or may smoothen the surface of) the substrate unit 101, and may prevent or substantially prevent the permeation of moisture and/or external air. The buffer layer 111 may include (e.g., or may be) an inorganic layer. The buffer layer 111 may include (or may be configured as) a single layer or multiple layers.

A thin-film transistor (e.g., or a circuit layer) TR is disposed on the buffer layer 111. At least one thin-film transistor TR may be disposed at (e.g., in or on) each of the pixels. The thin-film transistor TR may be a driving thin-film transistor. The thin-film transistor (e.g., each of the thin-film transistors) TR may include a semiconductor layer CH, a gate electrode GE, a source electrode SE, and a drain electrode DE.

In more detail, the semiconductor layer CH is disposed on the buffer layer 111. The semiconductor layer CH may include amorphous silicon, poly silicon, and/or an organic semiconductor. In another exemplary embodiment, the semiconductor layer CH may include (e.g., may be) an oxide semiconductor. The semiconductor layer CH may include a channel region, a source region, and a drain region. The source region and the drain region may be doped with impurities, and may be disposed at (e.g., on) sides (e.g., opposite sides) of the channel region, respectively.

A gate insulating layer 112 is disposed on the semiconductor layer CH. The gate insulating layer 112 may include (or may be) an inorganic layer. The gate insulating layer 112 may include (or may be configured as) a single layer or multiple layers.

A first conductive layer DCL1 may be disposed on the gate insulating layer 112. The first conductive layer DCL1 may include the gate electrode GE and a first electrode CE1 of a storage capacitor. The first conductive layer DCL1 may further include a plurality of scan lines. The gate electrode GE may be connected to one of the plurality of scan lines.

The first conductive layer DCL1 may include (or may be made of) a conductive metal material. For example, the first conductive layer DCL1 may include molybdenum (Mo), aluminum (Al), copper (Cu), titanium (Ti), and/or the like. The first conductive layer DCL1 may include (or may be configured as) a single layer or multiple layers.

A first interlayer dielectric layer 113 is disposed on the first conductive layer DCL1. The interlayer dielectric layer 113 may include (or may be) an inorganic layer. The first interlayer dielectric layer 113 may include (or may be configured as) a single layer or multiple layers.

A second conductive layer DCL2 may be disposed on the first interlayer dielectric layer 113. The second conductive layer DCL2 may include a second electrode CE2 of the storage capacitor. The second electrode CE2 and the first electrode CE1 of the first conductive layer DCL1 may form a capacitor (e.g., a storage capacitor Cst), with the first interlayer dielectric layer 113 used as a dielectric material. The second conductive layer DCL2 may include (or may be made of) a conductive metal material. For example, the second conductive layer DCL2 may include molybdenum (Mo), aluminum (Al), copper (Cu), titanium (Ti), and/or the like. The second conductive layer DCL2 may include (or may be configured as) a single layer or multiple layers.

A second interlayer dielectric layer 114 may be disposed on the second conductive layer DCL2. The second interlayer dielectric layer 114 may include (or may be) an inorganic layer. The second interlayer dielectric layer 114 may include (or may be configured as) a single layer or multiple layers.

A third conductive layer DCL3 may be disposed on the second interlayer dielectric layer 114. The third conductive layer DCL3 may include the source electrode SE, the drain electrode DE, and a source connection electrode SCE. In some embodiments, the third conductive layer DCL3 may further include a high-level voltage line, a low-level voltage line, and a plurality of data lines, but the present disclosure is not limited thereto.

The source electrode SE and the drain electrode DE may be electrically connected to the source region and the drain region of the semiconductor layer CH, respectively, through contact holes formed through each of the first interlayer dielectric layer 113, the second interlayer dielectric layer 114, and the gate insulating layer 112.

The source connection electrode SCE may be electrically connected to the thin-film transistor TR of each pixel. The source connection electrode SCE may be electrically connected to the touch member 30 through a contact hole.

The third conductive layer DCL3 includes (or is made of) a conductive metal material. For example, the third conductive layer DCL3 may include aluminum (Al), copper (Cu), titanium (Ti), molybdenum (Mo), and/or the like.

The display device 1 may further include a storage capacitor and a switching thin-film transistor on the substrate unit 101.

A protective layer 115 is disposed on the third conductive layer DCL3 and the second interlayer dielectric layer 114. The protective layer 115 is disposed to cover a pixel circuitry including the thin-film transistor TR. The protective layer 115 may include (or may be) a planarization layer. The planarization layer may include a suitable material, for example, such as acrylic and/or polyimide.

A plurality of first electrodes 121 may be disposed on the protective layer 115. The first electrodes 121 may be pixel electrodes that are each disposed in respective ones of the pixels. In addition, each of the first electrodes 121 may be an anode electrode of a corresponding organic light-emitting diode.

The first electrode 121 may be electrically connected to the drain electrode DE or the source electrode SE that are disposed on the substrate unit 101 through a via hole that extends (e.g., passes) through the protective layer 115.

The first electrode 121 may include a suitable material having a high work function. For example, the first electrode 121 may include indium-tin-oxide (ITO), indium-zinc-oxide (IZO), zinc oxide (ZnO), indium oxide ($In_2O_3$), and/or the like. Each of the above-described conductive materials has a relatively high work function and is transparent or substantially transparent. When the organic light-emitting display device is a top-emission organic light-emitting display device, the first electrode 121 may further include a reflective material, for example, such as silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca), or a combination thereof, in addition to (or in lieu of) the above-listed conductive materials. Accordingly, the first electrodes 121 may have a single-layer structure including a suitable conductive material and a suitable reflective material (e.g., from among the above-described conductive materials and reflective materials), or may have a multi-layer structure in which a plurality of single layers are stacked on one another.

A bank layer 116 is disposed on (e.g., over) the first electrode 121. The bank layer 116 includes a plurality of openings, each of the openings exposing at least a part (or a portion) of a respective one of the first electrodes 121. The bank layer 116 may include an organic material or an inorganic material. In an exemplary embodiment, the bank layer 116 may include a suitable material, for example, such as a photoresist, a polyimide resin, an acrylic resin, a silicon compound, a polyacrylic resin, and/or the like.

The emission layer (e.g., an organic emission layer) 122 is disposed on the first electrode 121 that is exposed by the opening of the bank layer 116. The organic emission layer 122 may include (or may be) a color emission layer for emitting a suitable color (e.g., a particular or desired color). For example, the organic emission layer 122 may include a red emission layer 122_1 for emitting red light, a green emission layer 122_2 for emitting green light, and a blue emission layer 122_3 for emitting blue light. The color emission layers may be disposed at (e.g., in or on) the pixels, respectively.

In some exemplary embodiments, the organic emission layer 122 may be formed as a single unit (e.g., a unitary layer), unlike that shown in FIG. 4. In other words, a single organic emission layer 122 may be shared by the pixels. The organic emission layer 122 may include (or may be made of) a color emission layer for emitting light having a suitable color. For example, the organic emission layer 122 may include (or may be) a blue emission layer for emitting blue light. In this case, wavelength conversion patterns may be further disposed on (e.g., above) the organic emission layer 122 for converting the color of the light emitted from the organic emission layer 122.

A second electrode 123 is disposed on the organic emission layer 122. The second electrode 123 may be a common electrode that extends across each of (e.g., all of) the pixels. In addition, the second electrode 123 may be a cathode electrode of the organic light-emitting diode.

The second electrode 123 may include (or may be made of) a suitable material having a low work function. For example, the second electrode 123 may include Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). The second electrode 123 may further include an auxiliary electrode. The auxiliary electrode may include a layer formed by depositing the suitable material, and depositing a suitable transparent metal oxide on the layer, for example, such as indium-tin-oxide (ITO), indium-zinc-oxide (IZO), zinc oxide (ZnO), indium-tin-zinc-oxide (ITZO), and/or the like.

When the display device 1 is a top-emission organic light-emitting diode display device, a thin conductive layer having a small work function may be formed as the second electrode 123, and a suitable transparent conductive layer, for example, such as an indium-tin-oxide (ITO) layer, an indium-zinc-oxide (IZO) layer, a zinc oxide (ZnO) layer, an indium oxide ($In_2O_3$) layer, and/or the like may be formed thereon.

As described above, the first electrode 121, the organic emission layer 122, and the second electrode 123 may form a light-emitting element.

A hole injection layer and/or a hole transport layer may be disposed between the first electrode 121 and the organic emission layer 122, and an electron transport layer and/or an electron injection layer may be disposed between the organic emission layer and the second electrode 123.

An encapsulation layer 117 is disposed on the second electrode 123. The encapsulation layer 117 includes at least one inorganic layer, and at least one organic layer. The at least one inorganic layer and the at least one organic layer may be stacked on one another. For example, the encapsulation layer 117 may include (or may be configured as) multiple layers including a first inorganic encapsulation layer 117a, an organic encapsulation layer 117b, and a second inorganic encapsulation layer 117c, which are stacked on one another (e.g., sequentially stacked on one another in the above-described order) as shown in FIG. 4. The first inorganic encapsulation layer 117a and the second inorganic encapsulation layer 117c may include one or more selected from the group consisting of silicon oxide (SiOx), silicon nitride (SiNx), and silicon oxynitride (SiONx). The organic encapsulation layer 117b may include one selected from the group consisting of epoxy, acrylate, and urethane acrylate.

The touch member 30 is disposed on the encapsulation layer 117. The touch member 30 may be in contact (e.g., in direct contact) with an upper surface of the second inorganic encapsulation layer 117c of the encapsulation layer 117.

The touch member 30 may include a touch insulating layer 310 and a touch conductive layer TCL disposed on the touch insulating layer 310.

The touch insulating layer 310 may be disposed on the second inorganic encapsulation layer 117c. For example, the touch insulating layer 310 may be disposed directly on the second inorganic encapsulation layer 117c. The touch insulating layer 310 may isolate the touch conductive layer TCL from the other plurality of conductive layers of the display member 20.

In an exemplary embodiment, the touch insulating layer 310 may include an inorganic insulating material. For example, the inorganic material may include at least one selected from the group consisting of silicon oxide (SiOx), silicon nitride (SiNx), and silicon oxynitride (SiONx). In another exemplary embodiment, the touch insulating layer 310 may include an organic material. For example, the organic material may include at least one selected from the group consisting of an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The touch conductive layer TCL may be disposed on the touch insulating layer 310. The touch conductive layer TCL may include a plurality of driving electrodes TE and a plurality of sensing electrodes RE. Further, the touch conductive layer TCL may include a touch driving signal line SLn2 that is electrically connected to the plurality of driving electrodes TE, and a touch sensing signal line SLn1 that is electrically connected to the plurality of sensing electrodes RE.

The driving electrodes TE may receive a touch driving signal TS from a touch driving circuit through the touch driving signal line SLn2, and may form a mutual capacitance with adjacent sensing electrodes RE. The sensing electrodes RE are disposed adjacent to the driving electrodes TE to which the touch driving signal TS is applied, and may transmit a capacitance value corresponding to (e.g., reflecting) the mutual capacitance to the touch driving circuit through the touch sensing signal line SLn1. The touch driving signal TS may include a plurality of pulses. The touch driving circuit may be implemented as a driving chip that is disposed on the driving board 90 shown in FIG. 1, but the present disclosure is not limited thereto.

The touch driving circuit may determine whether a touch is input or not based on the capacitance values between the driving electrodes TE to which the touch driving signal TS is applied and the sensing electrodes RE disposed adjacent thereto, and may calculate coordinates of the input touch.

The touch member 30 may include a touch sensor area TSA where the driving electrodes TE, the sensing electrodes RE, the touch driving signal lines SLn2, and the touch sensing signal lines SLn1 are disposed, and a non-sensor area NSA disposed around (e.g., to surround a periphery of) the touch sensor area TSA. The touch sensor area TSA may be located at a central area (e.g., a center) or substantially at the central area of the main region MR of the display device 1, and the non-sensor area NSA may be located at an edge (e.g., a bezel) of the main region MR and a lower end (e.g., a lower side) of the touch sensor area TSA in the first direction DR1. The non-sensor area NSA may be located at (e.g., in or on) each of the bending region BR and the subsidiary region SR of the display device 1. A portion of the non-sensor area NSA that is located at (e.g., in or on) the subsidiary region SR further includes subsidiary areas. For example, as shown in FIG. 5, the portion of the non-sensor area NSA that is located at the subsidiary region SR may further include a plurality of bridge portions MBR1 to MBR4 and a plurality of pad portions TPP1 and TPP2. The plurality of touch driving signal lines SLn2 and the plurality of touch sensing signal lines SLn1 that extend from the touch sensor area TSA or the main region MR to the subsidiary region SR are electrically connected (e.g., electrically merged or electrically linked) with each other through bridge electrodes at (e.g., in or on) the bridge portions MBR1 to MBR4, which will be described in more detail below. The touch driving signal lines SLn2 and the touch sensing signal lines SLn1, which are electrically connected (e.g., electrically merged or electrically linked) to each other, are connected to a plurality of pads that are disposed at (e.g., in or on) the pad portions TPP1 and TPP2.

In more detail, the driving chip 70 may be disposed at a central area (e.g., a center) of the subsidiary region SR. A first side and a second side of the subsidiary region SR in the second direction DR2 may be defined relative to the driving chip 70 when viewed from the top plan view. Each of a first bridge portion MBP1, a third bridge portion MBP3, and the first pad portion TPP1 may be located on the first side of the subsidiary region SR in the second direction DR2. Each of a second bridge portion MBP2, a fourth bridge portion MBP4, and the second pad portion TTP2 may be located on the second side of the subsidiary region SR in the second direction DR2. For example, the first bridge portion MBP1 and the second bridge portion MBP2 may be spaced apart from each other in the second direction DR2, the third bridge portion MBP3 and the fourth bridge portion MBP4 may be spaced apart from each other in the second direction DR2, and the first pad portion TPP1 and the second pad portion TTP2 may be spaced apart from each other in the second direction DR2.

The driving electrodes TE and the sensing electrodes RE may be disposed at (e.g., in or on) the touch sensor area TSA. A plurality of driving electrodes TE may be associated with a single sensing electrode RE. For example, the plurality of driving electrodes TE may form a capacitance value (e.g., the mutual capacitance) with the single sensing electrode RE. Different touch driving signals TS may be applied to the plurality of driving electrodes TE that are associated with the single sensing electrode RE, but the present disclosure is not limited thereto. As shown in FIG. 5, the length of a single sensing electrode RE in the first direction DR1 may be greater than the length of each of the driving electrodes TE that are associated with the single sensing electrode RE in the first direction DR1. The driving electrodes TE associated with the single sensing electrode RE may be located on a side (e.g., on one side) of the sensing electrode RE in the second direction DR2. The driving electrodes TE may be arranged along the first direction DR1, and may be spaced apart from each other along the first direction DR1.

The single sensing electrode RE and the plurality of driving electrodes TE that are associated with the single sensing electrode RE may form a touch cell. A plurality of touch cells may be arranged in a matrix of rows and columns in the touch sensor area TSA.

As described above, the touch sensing signal lines SLn1 and the touch driving signal lines SLn2 are connected to the sensing electrodes RE and the driving electrodes TE that form the touch cells. Because the touch sensing signal line SLn1 and the touch driving signal line SLn2 are disposed on the touch conductive layer (e.g., a single touch conductive layer) TCL at (e.g., in or on) the touch member 30 according to one or more exemplary embodiments of the present disclosure, there may be a large number of touch pads connected to the touch sensing signal line SLn1 and the touch driving signal line SLn2 that are connected to the sensing electrode RF and the driving electrodes TE if the touch pads are extended to the pad portions TPP1 and TPP2. As the number of the touch pads that are disposed at (e.g., in or on) the pad portions TPP1 and TPP2 increases, a width (e.g., of the subsidiary region SR) in the second direction DR2 increases. As a result, there may be insufficient space where other elements (e.g., a stylus pen mount) are to be disposed at (e.g., in or on) the recessed portion defined by the portions (e.g., where the main region MR is connected to or meets the bending region BR) that are cut into the L-shape of the bending region BR. Therefore, a bezel width may be increased, and a space where the driving chip 70 is disposed at (e.g., in or on) the subsidiary region SR may not be sufficient.

Referring to FIG. 6, each of the driving electrodes TE and the sensing electrodes RE may have a mesh structure to transmit light that is output from the active area AAR of the display member 20. For example, each of the driving electrodes TE and the sensing electrodes RE may include a plurality of mesh holes EA, and a part (or a portion) of the touch insulating layer 310 may be exposed via the mesh holes EA. The mesh holes EA of the driving electrodes TE and the sensing electrodes RE may overlap with an emission zone of the display member 20 in a third direction DR3, which defines the thickness direction. Further, an area of the mesh holes EA may be greater than an area of the emission zone of the display member 20. Accordingly, even though the driving electrodes TE and the sensing electrodes RE are located on the active area AAR of the display member 20, the light that is output from the active area AAR of the display member 20 may be transmitted through the driving electrodes TE and the sensing electrodes RE via the mesh holes EA.

In addition, like the driving electrodes TE and the sensing electrodes RE, the touch driving signal lines SL2n and the touch sensing signal lines SL1n that are connected to the driving electrodes TE and the sensing electrodes RE, respectively, may also include mesh holes EA.

Figure 7:
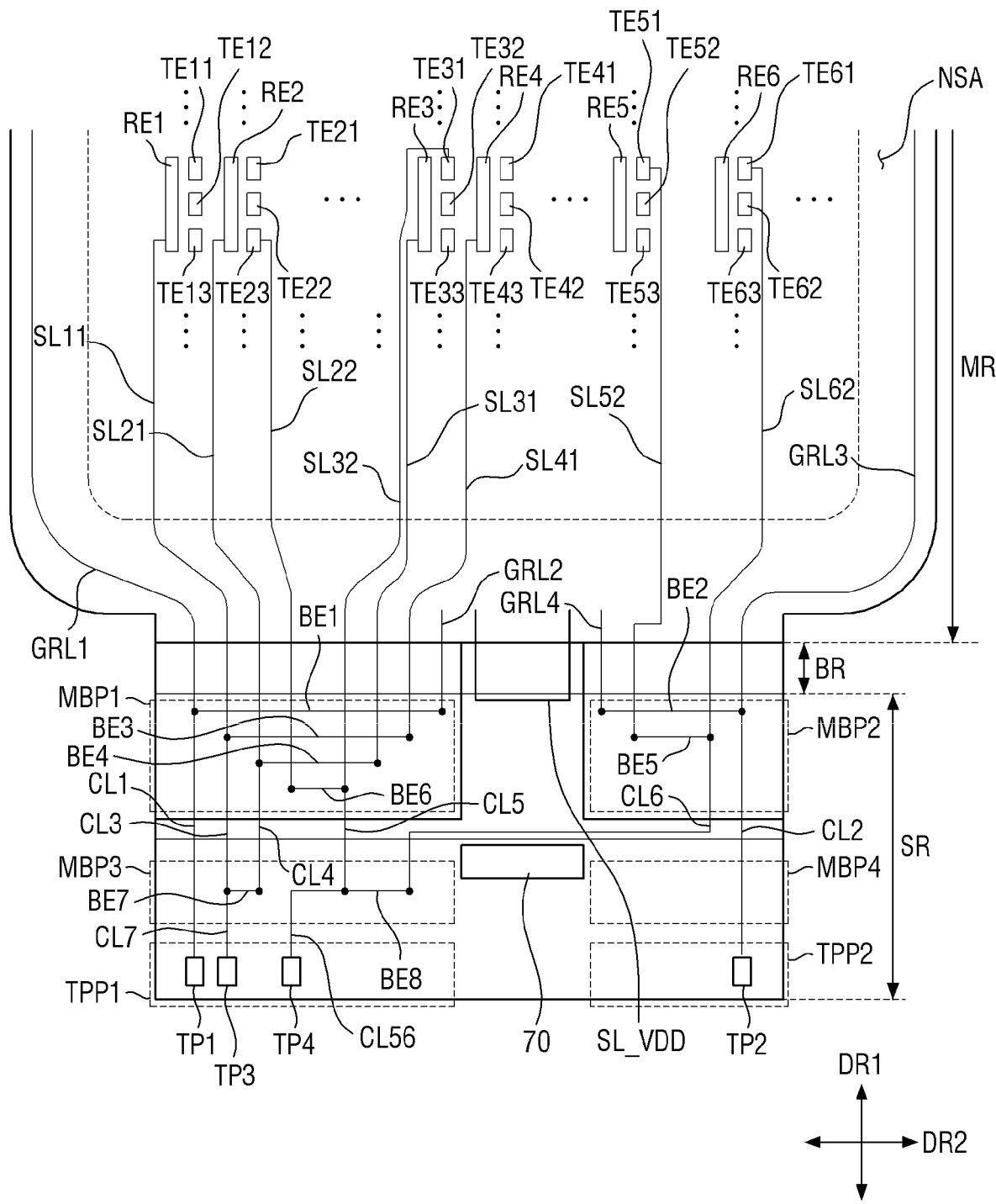
FIG. 7 is a view showing a layout of signal lines arranged at a main region, a bending region, and a subsidiary region according to an exemplary embodiment of the present disclosure.
Figure 8:
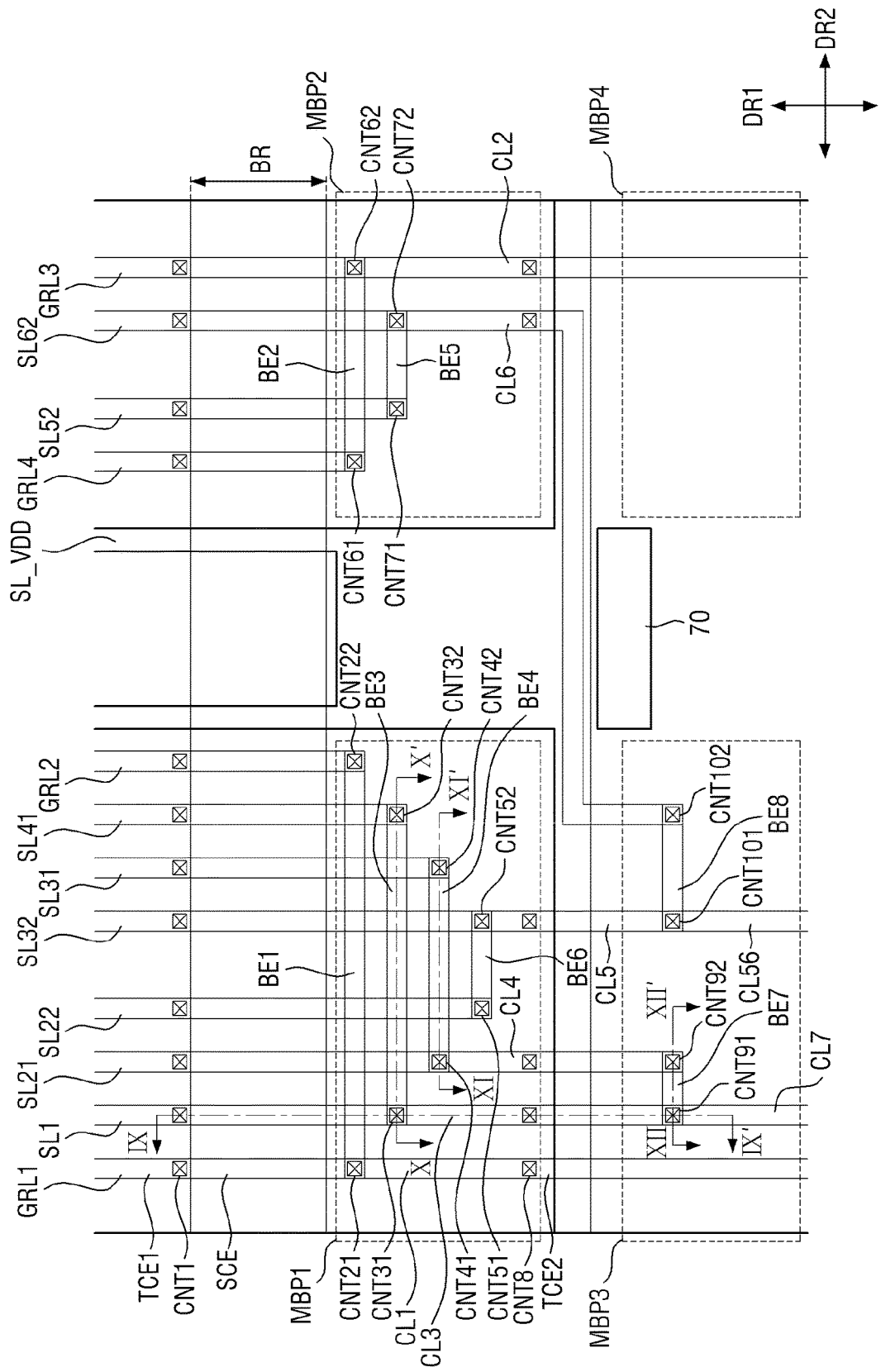
FIG. 8 is an enlarged view of a portion of FIG. 7.
Figure 9:
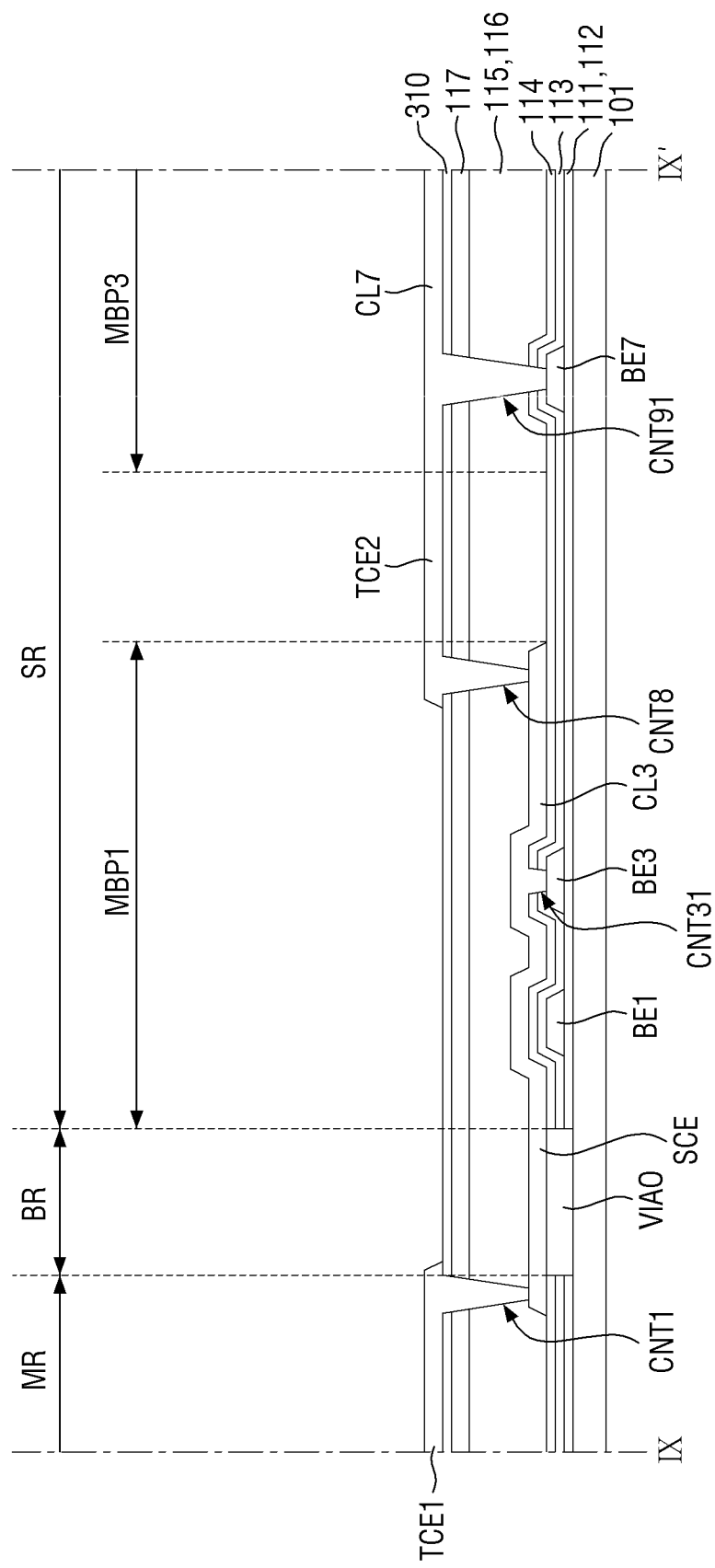
FIG. 9 is a cross-sectional view taken along the line IX-IX' of FIG. 8.
Figure 10:
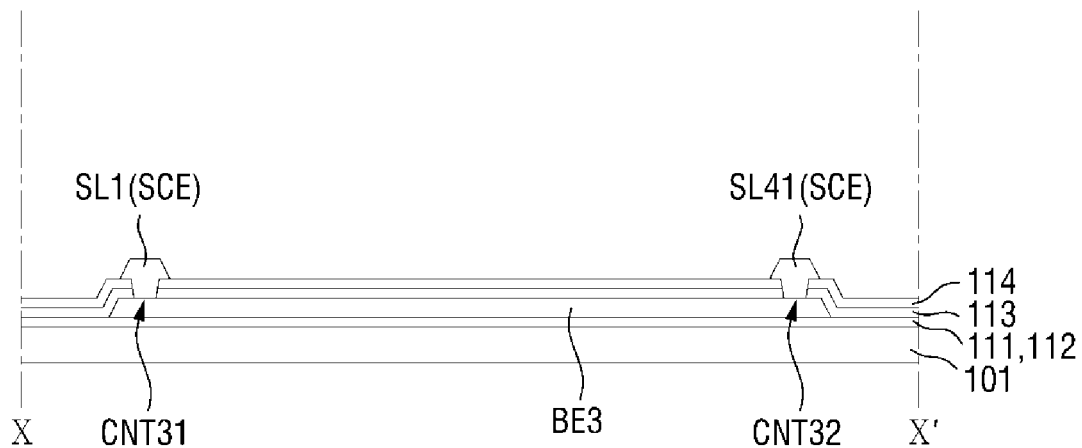
FIG. 10 is a cross-sectional view taken along the line X-X' of FIG. 8.
Figure 11:
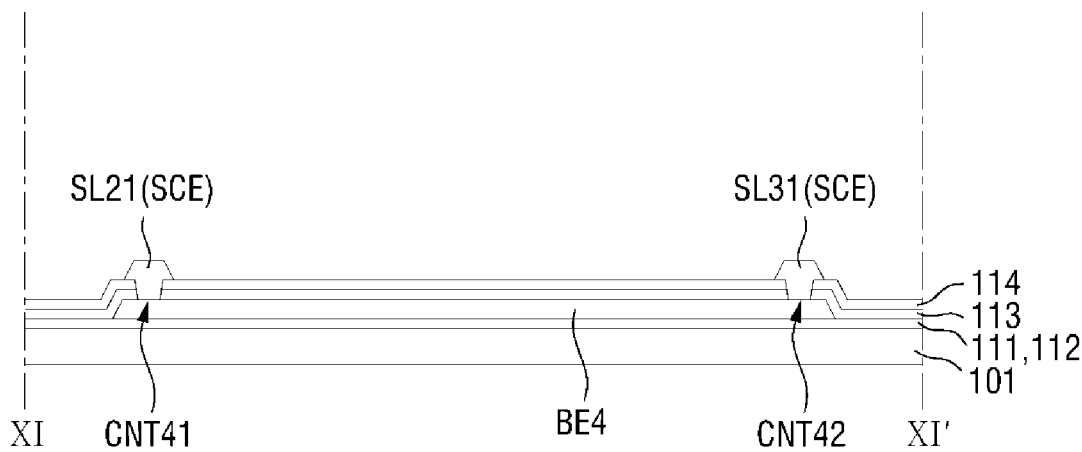
FIG. 11 is a cross-sectional view taken along the line XI-XI' of FIG. 8.
Figure 12:
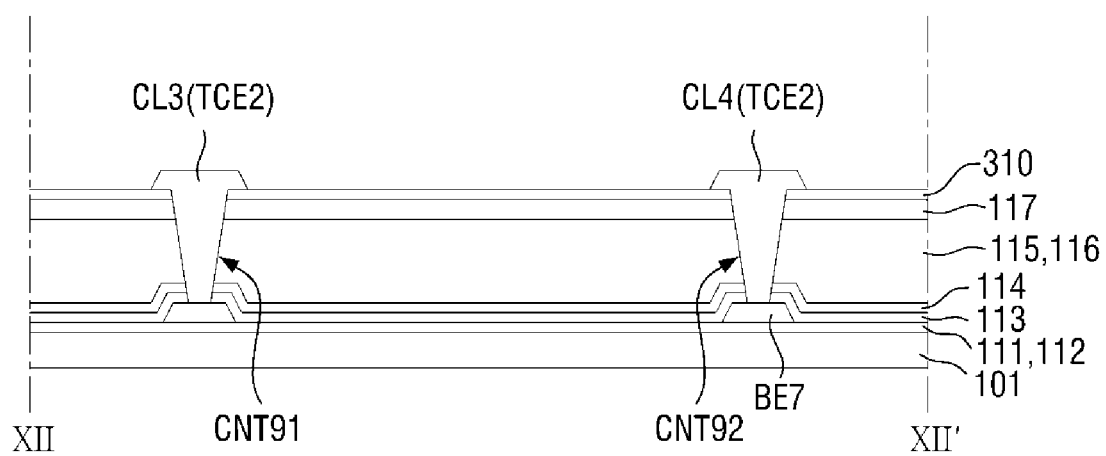
FIG. 12 is a cross-sectional view taken along the line XII-XII' of FIG. 8.

FIG. 7 is a view showing a layout of signal lines arranged at (e.g., in or on) a main region, a bending region, and a subsidiary region. FIG. 8 is an enlarged view of a portion of FIG. 7. FIG. 9 is a cross-sectional view taken along the line IX-IX' of FIG. 8. FIG. 10 is a cross-sectional view taken along the line X-X' of FIG. 8. FIG. 11 is a cross-sectional view taken along the line XI-XI' of FIG. 8. FIG. 12 is a cross-sectional view taken along the line XII-XII' of FIG. 8. However, the layout of the plurality of signal lines and the touch electrodes illustrated in FIGS. 7 and 8 are merely illustrative, and the present disclosure is not limited thereto, for example, as a variety of suitable layouts of the plurality of signal lines and the plurality of touch electrodes may be used according to one or more other exemplary embodiments. For example, as described below, the touch signal lines that are disposed at (e.g., in or on) the first bridge portion MBP1 may also be (e.g., or may instead be) disposed at (e.g., in or on) the second bridge portion MBP2.

Referring to FIGS. 7 to 12, the sensing electrode RE may include a first sensing electrode RE1 to a sixth sensing electrode RE6. The driving electrode TE may include a plurality of first driving electrodes (e.g., TE11 to TE13) TE1 that are associated with the first sensing electrode RE1, a plurality of second driving electrodes (e.g., TE21 to TE23) TE2 that are associated with the second sensing electrode RE2, a plurality of third driving electrodes (e.g., TE31 to TE33) TE3 that are associated with the third sensing electrode RE3, a plurality of fourth driving electrodes (e.g., TE41 to TE43) TE4 that are associated with the fourth sensing electrode RE4, a plurality of fifth driving electrodes (e.g., TE51 to TE53) TE5 that are associated with the fifth sensing electrode RE5, and a plurality of sixth driving electrodes (e.g., TE61 to TE63) TE6 that are associated with the sixth sensing electrode RE6. The plurality of first driving electrodes TE1 may include a first-first driving electrode TE11, a first-second driving electrode TE12, and a first-third driving electrode TE13. The plurality of second driving electrodes TE2 may include a second-first driving electrode TE21, a second-second driving electrode TE22, and a second-third driving electrode TE23. The plurality of third driving electrodes TE3 may include a third-first driving electrode TE31, a third-second driving electrode TE32, and a third-third driving electrode TE33. The plurality of fourth driving electrodes TE4 may include a fourth-first driving electrode TE41, a fourth-second driving electrode TE42, and a fourth-third driving electrode TE43. The plurality of fifth driving electrodes TE5 may include a fifth-first driving electrode TE51, a fifth-second driving electrode TE52, and a fifth-third driving electrode TE53. The plurality of sixth driving electrodes TE6 may include a sixth-first driving electrode TE61, a sixth-second driving electrode TE62, and a sixth-third driving electrode TE63.

The touch sensing signal lines SL1n may be connected to the sensing electrodes RE1 to RE6, and the touch driving signal lines SL2n may be connected to the driving electrodes TE11 to TE63. A first touch sensing signal line SL11 may be connected to the first sensing electrode RE1, a second touch sensing signal line SL21 may be connected to the second sensing electrode RE2, a third touch sensing signal line SL31 may be connected to the third sensing electrode RE3, a fourth touch sensing signal line SL41 may be connected to the fourth sensing electrode RE4, and the like. A second-second touch driving signal line SL22 may be connected to the second-third driving electrode TE23, a third-second touch driving signal line SL32 may be connected to the third-first driving electrode TE31, a fifth-second touch driving signal line SL52 may be connected to the fifth-first driving electrode TE51, a sixth-second touch driving signal line SL62 may be connected to the sixth-first driving electrode TE61, and the like.

In addition, the touch member 30 may further include a plurality of ground lines GRL1 to GRL4 disposed at (e.g., in or on) the non-sensor area NSA. A first ground line GRL1 may be disposed at (e.g., in or on) the non-sensor area NSA adjacent to (e.g., at a side of) the first touch sensing signal line SL11 of the touch member 30 in the second direction DR2. A second ground line GRL2 may be disposed between the fourth touch sensing signal line SL41 and the fifth-second touch driving signal line SL52. The second ground line GRL2 may be positioned at (e.g., on) a side of the driving chip 70 in the second direction DR2. A third ground line CRL3 may be disposed at (e.g., in or on) the non-sensor area NSA adjacent to (e.g., at a side of) the sixth-second touch driving signal line SL62 of the touch member 30 in the second direction DR2. A fourth ground line GRL4 may be disposed between the fourth touch sensing signal line SL41 and the fifth-second touch driving signal line SL52. The fourth ground line GRL4 may be positioned at (e.g., on) an opposite side of the driving chip 70 in the second direction DR2.

Each of the first touch sensing signal line SL11, the second touch sensing signal line SL21, the third touch sensing signal line SL31, the fourth touch sensing signal line SL41, the second-second touch driving signal line SL22, and the third-second touch driving signal line SL32 may extend (e.g., pass) through the first bridge portion MBP1 and the third bridge portion MBP3 of the subsidiary region SR.

Each of the fifth-second touch driving signal line SL52 and the sixth-second touch driving signal line SL62 may extend (e.g., pass) through the second bridge portion MBP2. Further, each of the first ground line GRL1 and the second ground line GRL2 may extend (e.g., pass) through the first bridge portion MBP1 and the third bridge portion MBP3, and each of the third ground line CRL3 and the fourth ground line GRL4 may extend (e.g., pass) through the second bridge portion MBP2 and the fourth bridge portion MBP4.

On the other hand, a supply voltage line SL_VDD may be further disposed on the subsidiary region SR between the driving chip 70 and the main region MR. The supply voltage line SL_VDD may receive a supply voltage from the printed circuit board 90 to supply the supply voltage to the plurality of pixels at (e.g., in or on) the active area AAR. The supply voltage line SL_VDD may be disposed between the first bridge portion MBP1 and the second bridge portion MBP2, between the first bridge portion MBP1 and the third bridge portion MBP3, and between the second bridge portion MBP2 and the fourth bridge portion MBP4 when viewed from the top plan view. The supply voltage line SL_VDD may be disposed on the third conductive layer DCL3 described above with reference to FIG. 4.

Each of the first ground line GRL1 and the second ground line GRL2 may extend in the first direction DR1. The first ground line GRL1 and the second ground line GRL2 may extend (e.g., pass) through the bending region BR to the first bridge portion MBP1. The first ground line GRL1 and the second ground line GRL2 may be electrically connected (electrically merged or electrically linked) with each other through a first bridge electrode BE1 at (e.g., in or on) the first bridge portion MBP1. The first bridge electrode BE1 may be disposed on the first conductive layer DCL1 described above with reference to FIG. 4. A first connection line CL1 that is connected to the first bridge electrode BE1 may extend in the first direction DR1 to pass through the third bridge portion MBP3, and may be connected to a first touch pad TP1. The first connection line CL1 may be electrically connected to each of the first ground line GRL1 and the second ground line GRL2. The first connection line CL1 may be positioned at (e.g., on) an opposite side of the first bridge electrode BE1 with respect to the first and second ground lines GRL1 and GRL2, with the first bridge electrode BE1 interposed therebetween.

Each of the third ground line GRL3 and the fourth ground line GRL4 may extend in the first direction DR1. The third ground line GRL3 and the fourth ground line GRL4 may extend (e.g., pass) through the bending region BR to the second bridge portion MBP2. The third ground line GRL3 and the fourth ground line GRL2 may be electrically connected (e.g., electrically merged or electrically linked) with each other through a second bridge electrode BE2 at (e.g., in or on) the second bridge portion MBP2. The second bridge electrode BE2 may be disposed on the first conductive layer DCL1 described above with reference to FIG. 4. A second connection line CL2 that is connected to the second bridge electrode BE2 may extend in the first direction DR1 to pass through the fourth bridge portion MBP4, and may be connected to a second touch pad TP2. The second connection line CL2 may be electrically connected to each of the third ground line GRL3 and the fourth ground line GRL4. The second connection line CL2 may be positioned at (e.g., on) an opposite side of the second bridge electrode BE2 with respect to the third and fourth ground lines GRL3 and GRL4, with the second bridge electrode BE2 interposed therebetween.

Each of the first touch sensing signal line SL11 and the fourth touch sensing signal line SL41 may extend in the first direction DR1. The first touch sensing signal line SL11 and the fourth touch sensing signal line SL41 may extend (e.g., pass) through the bending region BR to the first bridge portion MBP1. The first touch sensing signal line SL11 and the fourth touch sensing signal line SL41 may be electrically connected (e.g., electrically merged or electrically linked) with each other through a third bridge electrode BE3 at (e.g., in or on) the first bridge portion MBP1. The third bridge electrode BE3 may be disposed on the first conductive layer DCL1 described above with reference to FIG. 4. A third connection line CL3 that is connected to the third bridge electrode BE3 may extend in the first direction DR1 to the third bridge portion MBP3. The third connection line CL3 may be electrically connected to each of the first touch sensing signal line SL11 and the fourth touch sensing signal line SL41. The third connection line CL3 may be positioned at (e.g., on) an opposite side of the third bridge electrode BE3 with respect to the first touch sensing signal line SL11 and the fourth touch sensing signal line SL41, with the third bridge electrode BE3 interposed therebetween.

Each of the second touch sensing signal line SL21 and the third touch sensing signal line SL31 may extend in the first direction DR1. The second touch sensing signal line SL21 and the third touch sensing signal line SL31 may extend (e.g., pass) through the bending region BR to the first bridge portion MBP1. The second touch sensing signal line SL21 and the third touch sensing signal line SL31 may be electrically connected (e.g., electrically merged or electrically linked) with each other through a fourth bridge electrode BE4 at (e.g., in or on) the first bridge portion MBP1. The fourth bridge electrode BE4 may be disposed on the first conductive layer DCL1 described above with reference to FIG. 4. A fourth connection line CL4 that is connected to the fourth bridge electrode BE4 may extend in the first direction DR1 to the third bridge portion MBP3. The fourth connection line CL4 may be electrically connected to each of the second touch sensing signal line SL21 and the third touch sensing signal line SL31. The fourth connection line CL4 may be positioned at (e.g., on) an opposite side of the fourth bridge electrode BE4 with respect to the second touch sensing signal line SL21 and the third touch sensing signal line SL31, with the fourth bridge electrode BE4 interposed therebetween.

The third connection line CL3 and the fourth connection line CL4 may be electrically connected (e.g., electrically merged or electrically linked) with each other through a seventh bridge electrode BE7 at (e.g., in or on) the third bridge portion MBP3. The seventh bridge electrode BE7 may be disposed on the first conductive layer DCL1 described above with reference to FIG. 4. A seventh connection line CL7 that is electrically connected to the seventh bridge electrode BE7 may extend in the first direction DR1 to the first pad portion TPP1. The seventh connection line CL7 may be connected to a third touch pad TP3 at (e.g., in or on) the first pad portion TPP1. The seventh connection line CL7 may be electrically connected to each of the third and fourth connection lines CL3 and CL4. The seventh connection line CL7 may be positioned at (e.g., on) an opposite side of the seventh bridge electrode BE7 with respect to the third and fourth connection lines CL3 and CL4, with the seventh bridge electrode BE7 interposed therebetween.

Each of the second-second touch driving signal line SL22 and the third-second touch driving signal line SL32 may extend in the first direction DR1. The second-second touch driving signal line SL22 and the third-second touch driving signal line SL32 may extend (e.g., pass) through the bending region BR to the first bridge portion MBP1. The second-second touch driving signal line SL22 and the third-second touch driving signal line SL32 may be electrically connected (e.g., electrically merged or electrically linked) with each other through a sixth bridge electrode BE6 at (e.g., in or on) the first bridge portion MBP1. The sixth bridge electrode BE6 may be disposed on the first conductive layer DCL1 described above with reference to FIG. 4. A fifth connection line CL5 that is connected to the sixth bridge electrode BE6 may extend in the first direction DR1 to the third bridge portion MBP3. The fifth connection line CL5 may be electrically connected to each of the second-second touch sensing signal line SL22 and the third-second touch driving signal line SL32. The fifth connection line CL5 may be positioned at (e.g., on) an opposite side of the sixth bridge electrode BE6 with respect to the second-second touch driving signal line SL22 and the third-second touch driving signal line SL32, with the sixth bridge electrode BE6 interposed therebetween.

Each of the fifth-second touch driving signal line SL52 and the sixth-second touch driving signal line SL62 may extend in the first direction DR1. The fifth-second touch driving signal line SL52 and the sixth-second touch driving signal line SL62 may extend (e.g., pass) through the bending region BR to the second bridge portion MBP2. The fifth-second touch driving signal line SL52 and the sixth-second touch driving signal line SL62 may be electrically connected (e.g., electrically merged or electrically linked) with each other through a fifth bridge electrode BE5 at (e.g., in or on) the second bridge portion MBP2. The fifth bridge electrode BE5 may be disposed on the first conductive layer DCL1 described above with reference to FIG. 4. A sixth connection line CL6 that is connected to the fifth bridge electrode BE5 may extend in the first direction DR1, and may be bent in the second direction DR2 between the second bridge portion MBP2 and the fourth bridge portion MBP4 to extend to the third bridge portion MBP3. The sixth connection line CL6 may be electrically connected to each of the fifth-second touch driving signal line SL52 and the sixth-second touch driving signal line SL62. The sixth connection line CL6 may be positioned at (e.g. on) an opposite side of the fifth bridge electrode BE5 with respect to the fifth-second touch driving signal line SL52 and the sixth-second touch driving signal line SL62, with the fifth bridge electrode 13E5 interposed therebetween.

The fifth connection line CL5 and the sixth connection line CL6 may be electrically connected (e.g., electrically merged or electrically linked) with each other through an eighth bridge electrode BE8 at (e.g., in or on) the third bridge portion MBP3. The eighth bridge electrode BE8 may be disposed on the first conductive layer DCL1 described above with reference to FIG. 4. A fifty-sixth connection line CL56 that is electrically connected to the eighth bridge electrode BE8 may extend in the first direction DR1 to the first pad portion TPP1. The fifty-sixth connection line CL56 may be connected to a fourth touch pad TP4 at (e.g., in or on) the first pad portion TPP1. The fifty-sixth connection line CL56 may be electrically connected to each of the fifth and sixth connection lines CL5 and CL6. The fifty-sixth connection line CL56 may be positioned at (e.g., on) an opposite side of the eighth bridge electrode BE8 with respect to the fifth and sixth connection lines CL6 and CL6, with the eighth bridge electrode BE8 interposed therebetween.

Referring to FIGS. 8 to 12, each of the first touch sensing signal line SL11, the second touch sensing signal line SL21, the third touch sensing signal line SL31, the fourth touch sensing signal line SL41, the second-second touch driving signal line SL22, the third-second touch driving signal line SL32, the fifth-second touch driving signal line SL52, the sixth-second touch driving signal line SL62, the first ground line CRL1, and the second ground line CRL2 may include a first touch connection electrode TCE1 that is disposed at (e.g., in or on) the main region MR, and a source connection electrode SCE that is connected to (e.g., in contact with) the first touch connection electrode TCE1 through a first contact hole CNT1. The first touch connection electrode TCE1 may be disposed on the touch conductive layer TCL, and the source connection electrode SCE may be disposed on the third conductive layer DCL3. The first contact hole CNT1 may extend (e.g., penetrate) through each of the touch insulating layer 310, the encapsulation layer 117, the bank layer 116, and the protective layer 115.

The first touch connection electrode TCE1 may extend in the first direction DR1. The first touch connection electrode TCE1 may extend from the main region MR in the first direction DR1 to the first contact hole CNT1, and may be electrically connected to the source connection electrode SCE through the first contact hole CNT1 at (e.g., in or on) the main region MR that is adjacent to the bending region BR when viewed from the top plan view. The source connection electrode SCE may be disposed on each of the bending region BR and the subsidiary region SR. The source connection electrode SCE may be disposed to extend to the first bridge portion MBP1 and/or the second bridge portion MBP2 of the subsidiary region SR.

At (e.g., in or on) the bending region BR, a via layer VIAO may be disposed on the substrate unit 101, and the source connection electrode SCE may be disposed on the via layer VIAO. In other words, the via layer VIAO may be disposed between the source connection electrode SCE and the substrate unit 101. At (e.g., in or on) the bending region BR, the inorganic layers (e.g., portions of the inorganic layers) described above with reference to FIG. 4 may be removed and the via layer VIAO may be disposed, so that a bending stress may be reduced.

The source connection electrode SCE of each of the first and second ground lines GRL1 and GRL2 may be electrically connected to the first bridge electrode BE1 that extends in the second direction DR2 at (e.g., in or on) the first bridge portion MBP1 through a twenty-first contact hole CNT21 and a twenty-second contact hole CNT22. The source connection electrode SCE of each of the first and second ground lines GRL1 and GRL2 may be extended in the first direction DR1 through the first connection line CL1 described above (e.g., may be connected to the first connection line CL1). Each of the twenty-first contact hole CNT21 and the twenty-second contact hole CNT22 may extend (e.g., penetrate) through each of the first and second interlayer insulating layers 113 and 114.

The source connection electrode SCE of each of the third and fourth ground lines CRL3 and CRL4 may be electrically connected to the second bridge electrode BE2 that extends in the second direction DR2 at (e.g., in or on) the second bridge portion MBP2 through a sixty-first contact hole CNT61 and a sixty-second contact hole CNT62. The source connection electrode of each of the third and fourth ground lines CRL3 and CRL4 may be extended in the first direction DR1 through the second connection line CL2 described above (e.g., may be connected to the second connection line CL2). Each of the sixty-first contact hole CNT61 and the sixty-second contact hole CNT62 may extend (e.g., penetrate) through each of the first and second interlayer insulating layers 113 and 114.

The source connection electrode SCE of each of the first touch sensing signal line SL11 and the fourth touch sensing signal line SL41 may be electrically connected to the third bridge electrode BE3 that extends in the second direction DR2 at (e.g., in or on) the first bridge portion MBP1 through a thirty-first contact hole CNT31 and a thirty-second contact hole CNT32. The source connection electrode SCE of each of the first touch sensing signal line SL11 and the fourth touch sensing signal line SL41 may be extended in the first direction DR1 through the third connection line CL3 described above (e.g., may be connected to the third connection line CL3). Each of the thirty-first contact hole CNT31 and the thirty-second contact hole CNT32 may extend (e.g., penetrate) through each of the first and second interlayer insulating layers 113 and 114.

The source connection electrode SCE of each of the second touch sensing signal line SL21 and the third touch sensing signal line SL31 may be electrically connected to the fourth bridge electrode BE4 that extends in the second direction DR2 at (e.g., in or on) the first bridge portion MBP1 through a forty-first contact hole CNT41 and a forty-second contact hole CNT42. The source connection electrode SCE of each of the second touch sensing signal line SL21 and the third touch sensing signal line SL31 may be extended in the first direction DR1 through the fourth connection line CL4 described above (e.g., may be connected to the fourth connection line CL4). Each of the forty-first contact hole CNT41 and the forty-second contact hole CNT42 may extend (e.g., penetrate) through each of the first and second interlayer insulating layers 113 and 114.

The source connection electrode SCE of each of the second-second touch driving signal line SL22 and the third-second touch driving signal line SL32 may be electrically connected to the sixth bridge electrode BE6 that extends in the second direction DR2 at (e.g., in or on) the first bridge portion MBP1 through a fifty-first contact hole CNT51 and a fifty-second contact hole CNT52. The source connection electrode SCE of each of the second-second touch driving signal line SL22 and the third-second touch driving signal line SL32 may be extended in the first direction DR1 through the fifth connection line CL5 described above (e.g., may be connected to the fifth connection line CL5). Each of the fifty-first contact hole CNT51 and the fifty-second contact hole CNT52 may extend (e.g., penetrate) through each of the first and second interlayer insulating layers 113 and 114.

The source connection electrode SCE of each of the fifth-second touch driving signal line SL52 and the sixth-second touch driving signal line SL62 may be electrically connected to the fifth bridge electrode BE5 that extends in the second direction DR2 at (e.g., in or on) the second bridge portion MBP2 through a seventy-first contact hole CNT71 and a seventy-second contact hole CNT72. The source connection electrode SCE of each of the fifth-second touch driving signal line SL52 and the sixth-second touch driving signal line SL62 may be extended in the first direction DR1 through the sixth connection line CL6 described above (e.g., may be connected to the sixth connection line CL6). Each of the seventy-first contact hole CNT71 and the seventy-second contact hole CNT72 may extend (e.g., penetrate) through each of the first and second interlayer insulating layers 113 and 114.

The source connection electrode SCE of each of the first connection line CL1 to the sixth connection line CL6 may extend to an end of a respective one of the first and second bridge portions MBP1 and MBP2 in the first direction DR1, and may be electrically connected to a second touch connection electrode TCE2 that extends in the first direction DR1 through an eighth contact hole CNT8. The eighth contact hole CNT8 may be disposed at (e.g., in or on) the subsidiary region SR when viewed from the top plan view, and may be disposed at (e.g., in or on) the first and second bridge portions MBP1 and MBP2 when viewed from the top plan view. Like the first contact hole CNT1, the eighth contact hole CNT8 may extend (e.g., penetrate) through each of the touch insulating layer 310, the encapsulation layer 117, the bank layer 116, and the protective layer 115. The second touch connection electrode TCE2 may be disposed on the touch conductive layer TCL, and may be disposed at (e.g., on) the same or substantially the same layer as that of the first touch connection electrode TCE1.

The second touch connection electrode TCE2 may extend to the first and second bridge portions MBP1 and MBP2 as well as to the third and fourth bridge portions MBP3 and MBP4. The second touch connection electrode TCE2 may be further extended to the first and second pad portions TPP1 and TPP2 to be connected to the plurality of touch pads.

Each of the second touch connection electrode TCE2 of the third connection line CL3 and the second touch connection electrode TCE2 of the fourth connection line CL4 may be electrically connected to a seventh bridge electrode BE7 that extends in the second direction DR2 at (e.g., in or on) the third bridge portion MBP3 through a ninety-first contact hole CNT91 and a ninety-second contact hole CNT92. Each of the second touch connection electrode TCE2 of the third connection line CL3 and the second touch connection electrode TCE2 of the fourth connection line CL4 may be extended in the first direction DR1 through the seventh connection line CL7 described above (e.g., may be connected to the seventh connection line CL7). Each of the ninety-first contact hole CNT91 and the ninety-second contact hole CNT9 may extend (e.g., penetrate) through each of the first and second interlayer dielectric layers 113 and 114, the touch insulating layer 310, the encapsulation layer 117, the bank layer 116, and the protective layer 115.

Each of the second touch connection electrode TCE2 of the fifth connection line CL5 and the second touch connection electrode TCE2 of the sixth connection line CL6 may be electrically connected to the eighth bridge electrode BE8 that extends in the second direction DR2 at (e.g., in or on) the third bridge portion MBP3 through a one-hundred-first contact hole CNT101 and a one-hundred-second contact hole CNT102. Each of the second touch connection electrode TCE2 of the fifth connection line CL5 and the second touch connection electrode TCE2 of the sixth connection line CL6 may be extended in the first direction DR1 through the fifty-sixth connection line CL56 described above (e.g., may be connected to the fifty-sixth connection line CL56). Each of the one-hundred-first contact hole CNT101 and the one-hundred-second contact hole CNT102 may extend (e.g., penetrate) through each of the first and second interlayer dielectric layers 113 and 114, the touch insulating layer 310, the encapsulation layer 117, the bank layer 116, and the protective layer 115.

Each of the second touch connection electrodes TCE2 of the first to sixth connection lines CL1 to CL6 may overlap with the supply voltage line SL_VDD in the thickness direction. However, no short circuit is created between the second touch connection electrodes TCE2 and the supply voltage line SL_VDD, because the supply voltage line SL_VDD is disposed on the third conductive layer DCL3 as described above while the second touch connection electrodes TCE2 of the first connection line CL1 to the sixth connection line CL6 are disposed on the touch conductive layer TCL, which is a different layer from the third conductive layer DCL3 as described above.

As described above, because the touch sensing signal line SLn1 and the touch driving signal line SLn2 are disposed on a single touch conductive layer TCL at (e.g., in) the touch member 30 according to one or more exemplary embodiments of the present disclosure, there may be a large number of touch pads that are connected to the touch sensing signal line SLn1 and the touch driving signal line SLn2 connected to the electrodes RE and TE if the touch pads are extended to the pad portions TPP1 and TPP2. As the number of the touch pads disposed at (e.g., in or on) the pad portions TPP1 and TPP2 increases, the width (e.g., of the subsidiary region SR) in the second direction DR2 increases. As a result, there may be insufficient space where other elements (e.g., a stylus pen mount) are to be disposed at (e.g., in or on) the recessed portion that is cut in the L-shape at (e.g., in or on) the bending region BR. Accordingly, the width of the bezel may be increased, and there may be insufficient space where the driving chip 70 is to be disposed at (e.g., in or on) the subsidiary region SR. In this regard, according to one or more of the above-described exemplary embodiments of the present disclosure, a plurality of touch signal lines that are connected to a plurality of touch electrodes may be electrically connected (e.g., electrically merged or electrically linked) to each other through bridge electrodes that are arranged in a direction that crosses a direction in which the touch signal lines extend to a pad. Accordingly, a number of the touch pads may be reduced. In addition, as described above, the bridge portions at (e.g., in or on) which the bridge electrodes are disposed may also include portions where the touch signal lines are first connected (e.g., merged or linked) with each other, for example, such as at the first bridge portion and the second bridge portion, and portions where the connected (e.g., merged or linked) touch signal lines are again connected (e.g., merged or linked) with each other, for example, such as at the third bridge portion and the fourth bridge portion. Accordingly, the number of touch pads may be further reduced (e.g., significantly reduced).

In addition, the touch signal lines that are connected (e.g., merged or linked) with each other or with other signal lines at (e.g., in or on) the first bridge portion MBP1 that is positioned on one side of the driving chip 70 in the second direction DR2 and the touch signal lines that are connected (e.g., merged or linked) with each other or with other signal lines at (e.g., in or on) the second bridge portion MBP2 that is positioned on an opposite side of the driving chip 70 in the second direction DR2 may extend to the third bridge portion MBP3 to be connected (e.g., merged or linked) with each other. Accordingly, the number of the touch pads may be further reduced. As a result, a sufficient area where the driving chip 70 is to be mounted on the display panel 20 may be provided. In addition, a dead space may be reduced in the touch pad unit.

Hereinafter, display devices according to one or more other exemplary embodiments of the present disclosure will be described. In the following description, the same or substantially the same (e.g., or similar) elements will be denoted by the same or substantially the same (e.g., similar) reference symbols, and thus, redundant descriptions thereof may not be repeated or may be briefly described.

Figure 13:
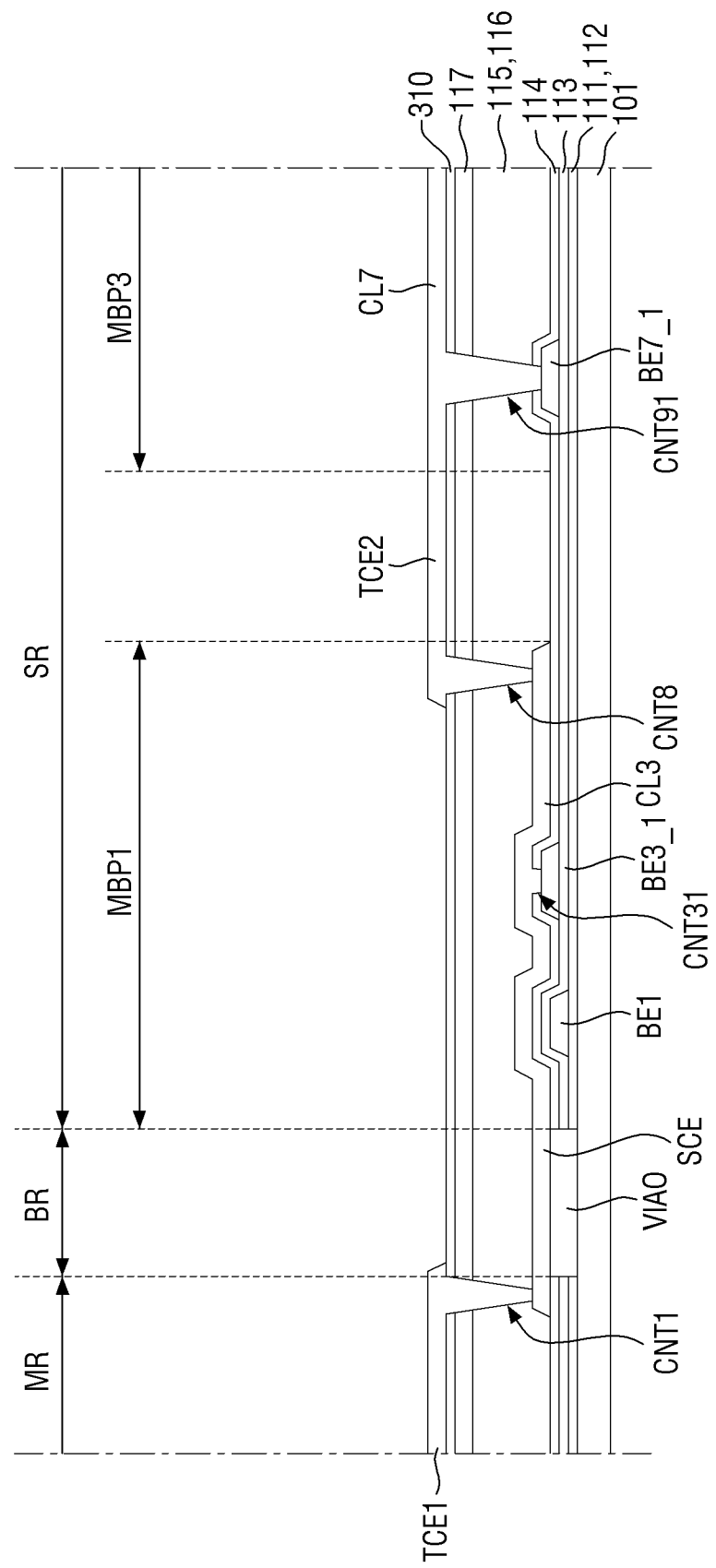
FIGS. 13-16 are cross-sectional views of a display device according to another exemplary embodiment.
Figure 14:
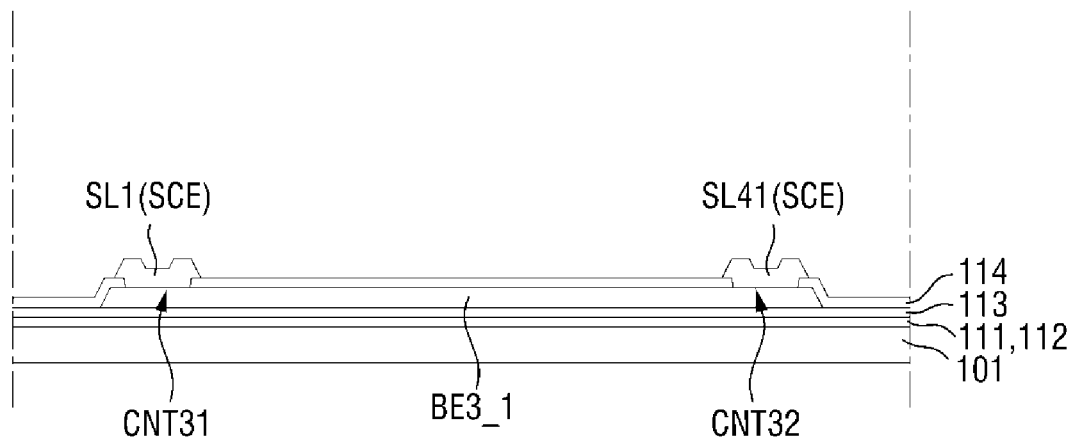
Figure 15:
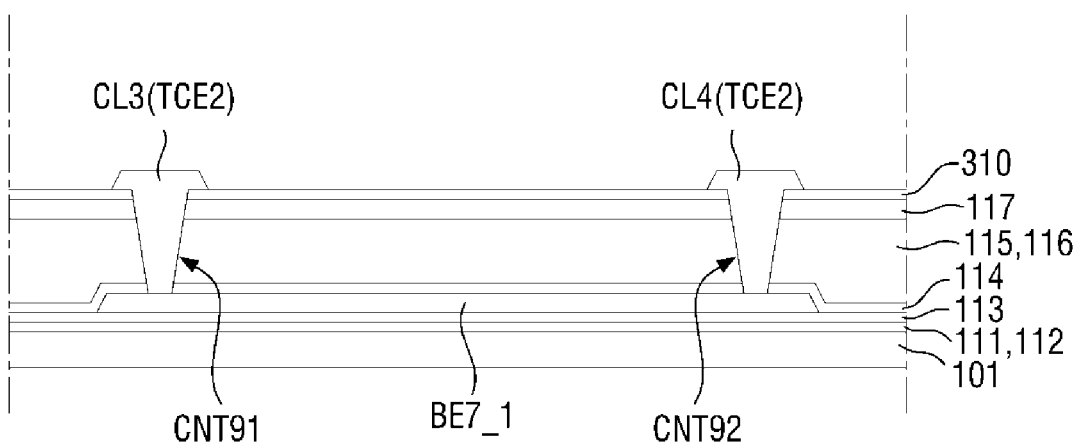

FIGS. 13 to 15 are cross-sectional views of a display device according to another exemplary embodiment.

A touch member of a display device according to the exemplary embodiment shown in FIGS. 13 to 15 is different from the touch member of the display device according to one or more of the above-described exemplary embodiments in that the bridge electrodes are disposed on a second conductive layer DCL2.

In more detail, at (e.g., in) the touch member according to this exemplary embodiment, the bridge electrodes may be disposed on the second conductive layer DCL2. For example, as shown in FIGS. 13 to 15, a third bridge electrode BE3_1 and a seventh bridge electrode BE7_1 may be disposed on the second conductive layer DCL2. While it is described that the third bridge electrode BE3_1 and the seventh bridge electrode BE7_1 are disposed on the second conductive layer DCL2 according to this exemplary embodiment, the present disclosure is not limited thereto. For example, in some exemplary embodiments, one or more of the other bridge electrodes described above may also be disposed on the second conductive layer DCL2 at (e.g., in) the touch member 30. Furthermore, in some exemplary embodiments, some of the bridge electrodes in the touch member may be disposed on the first conductive layer DCL1 while some others of the bridge electrodes in the touch member may be disposed on the second conductive layer DCL2.

Figure 16:
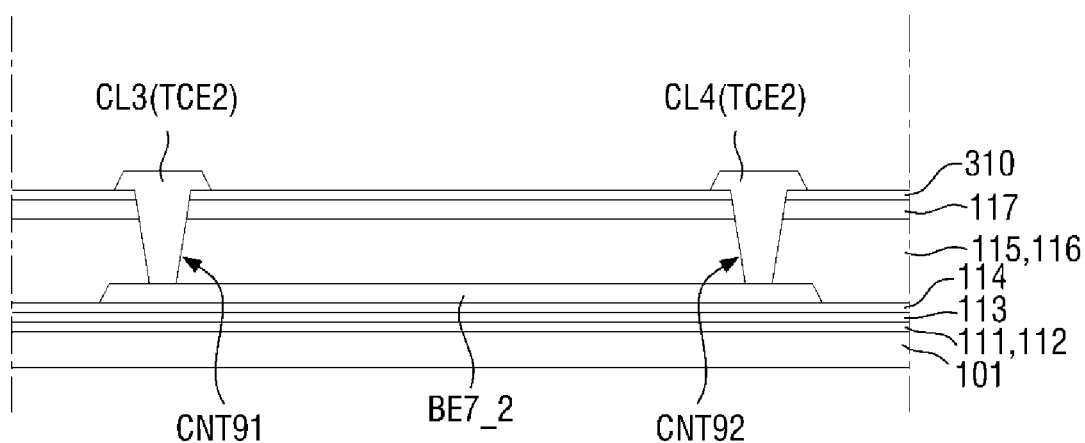

FIG. 16 is a cross-sectional view of a display device according to another exemplary embodiment of the present disclosure.

A touch member of a display device according to the exemplary embodiment shown in FIG. 16 is different from the touch member of the display device according to one or more of the above-described exemplary embodiments in that the second touch connection electrodes TCE2 of the connection lines are electrically connected through a bridge electrode that is disposed on the third conductive layer DCL3.

In more detail, in the touch member of the display device according to this exemplary embodiment, the second touch connection electrodes TCE2 of the connection lines may be electrically connected to each other through a bridge electrode that is disposed on the third conductive layer DCL3. For example, a seventh bridge electrode BE7_2 may be disposed on the third conductive layer DCL3. In some embodiments, an eighth bridge electrode may also be disposed on the third conductive layer DCL3. Furthermore, in some embodiments, some of the bridge electrodes of the touch member may be disposed on the first conductive layer DCL1 and/or the second conductive layer DCL2 while some others of the bridge electrodes may be disposed on the third conductive layer DCL3.

Figure 17:
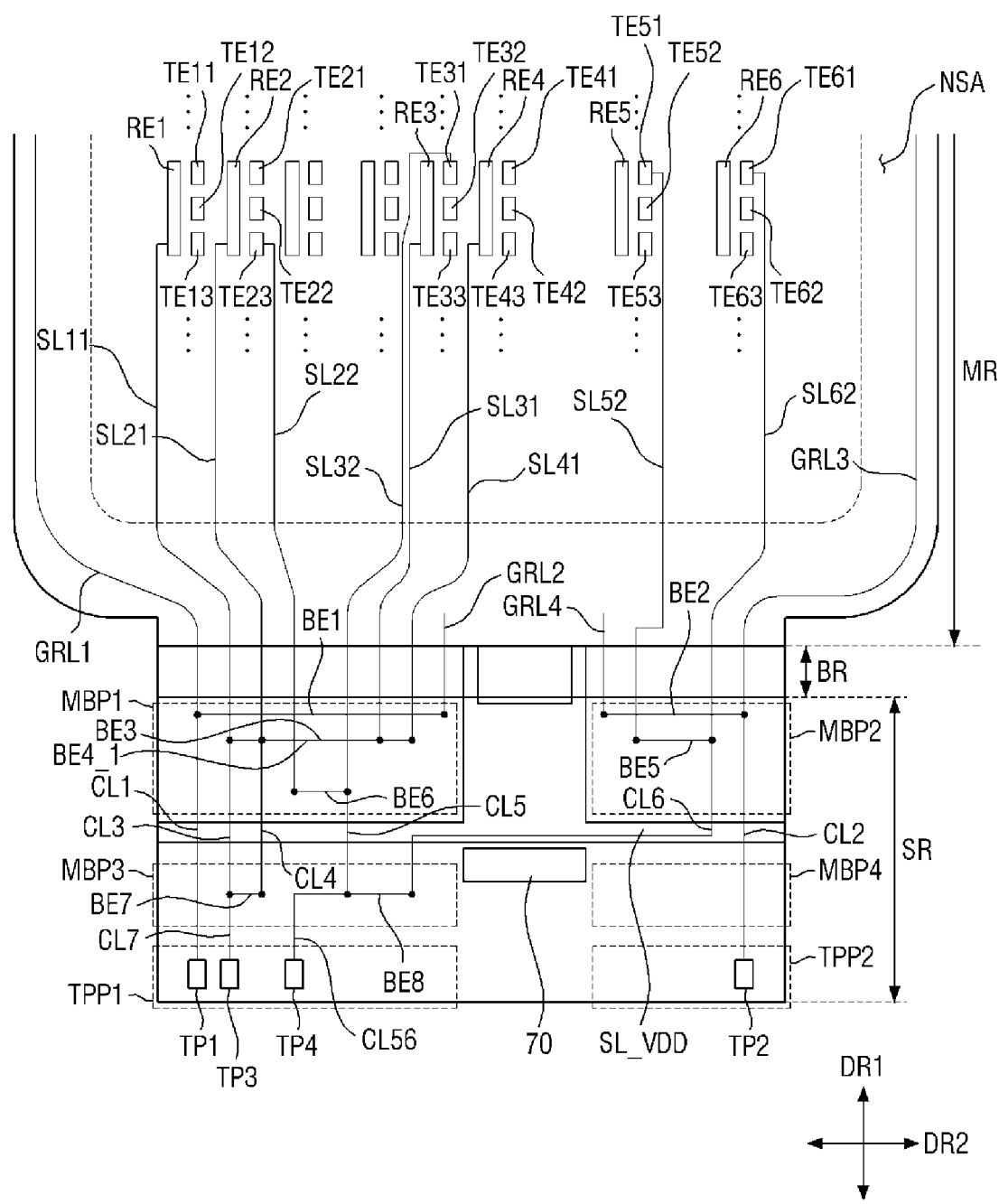
FIG. 17 is a view showing a layout of signal lines arranged at a main region, a bending region, and a subsidiary region according to another exemplary embodiment.
Figure 18:
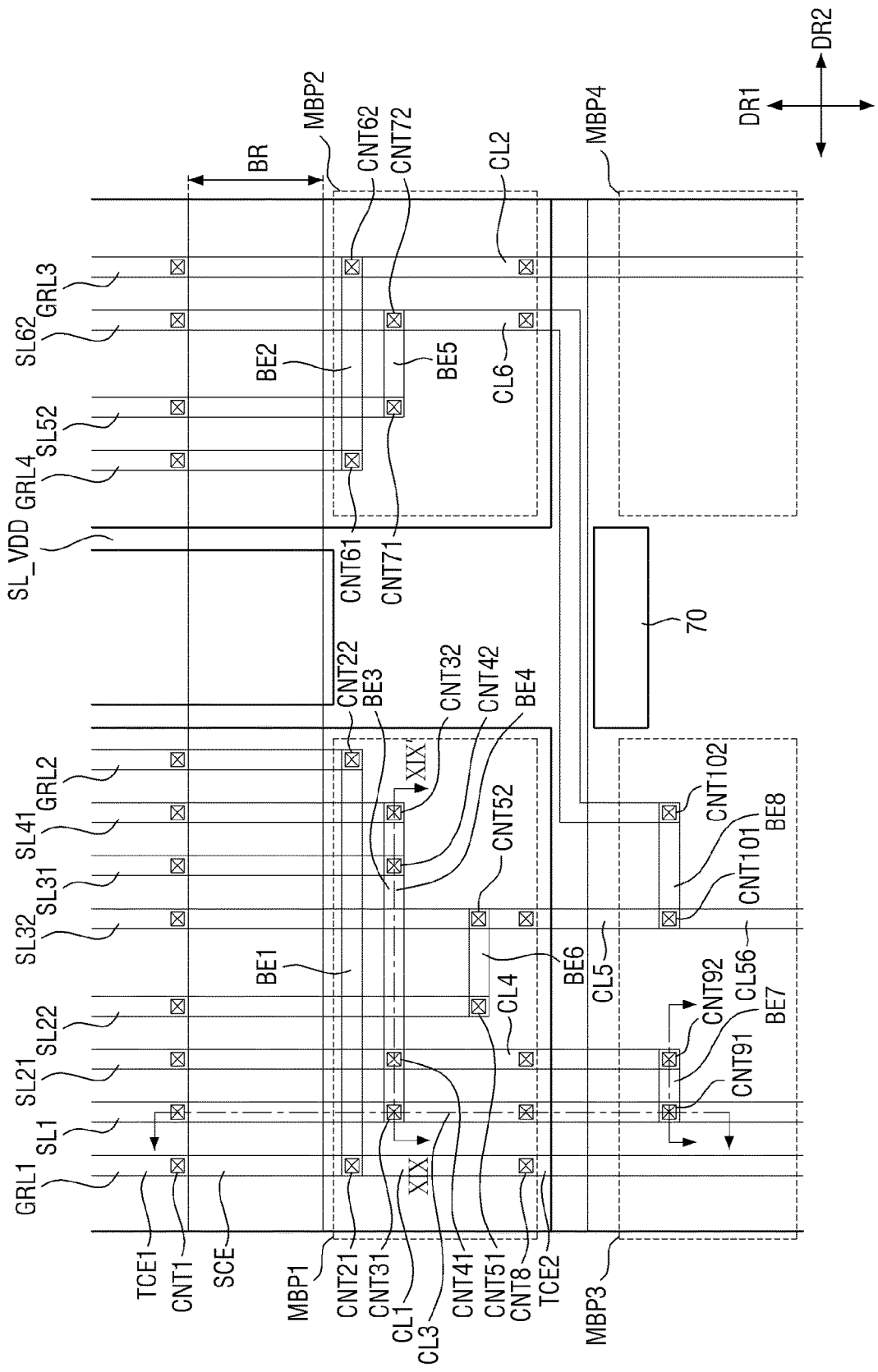
FIG. 18 is an enlarged view of a portion of FIG. 17.
Figure 19:
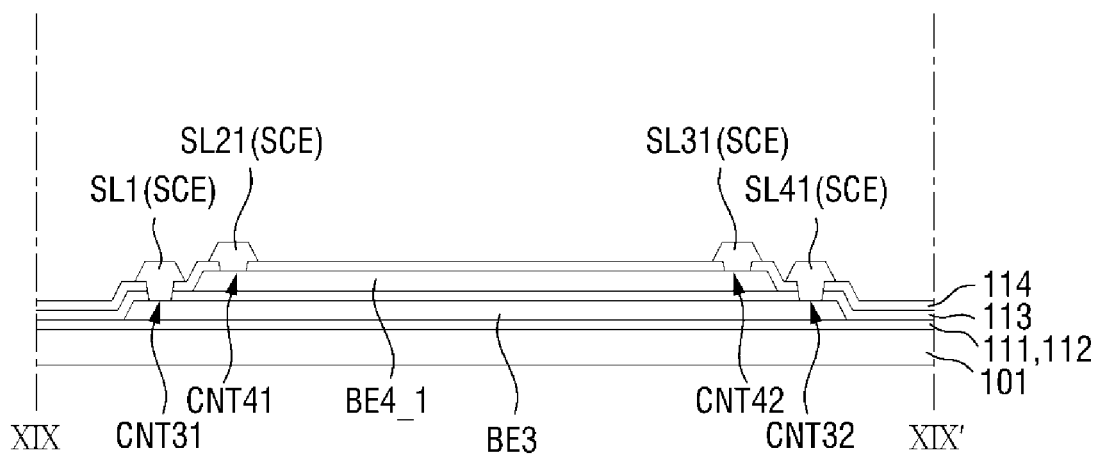
FIG. 19 is a cross-sectional view taken along the line XIX-XIX' of FIG. 18.

FIG. 17 is a view showing a layout of signal lines arranged in a main region, a bending region, and a subsidiary region according to another exemplary embodiment. FIG. 18 is an enlarged view of a portion of FIG. 17. FIG. 19 is a cross-sectional view taken along the line XIX-XIX' of FIG. 18.

A touch member of a display device according to the exemplary embodiment shown in FIGS. 17 to 19 is different from the touch member of the display device according to one or more of the above-described exemplary embodiments in that the bridge electrodes overlap with each other in the thickness direction.

In more detail, in the touch member of the display device according to this exemplary embodiment, the bridge electrodes may be disposed such that they overlap with each other in the thickness direction. For example, as shown in FIG. 17, the third bridge electrode BE3 and the fourth bridge electrode BE4_1 may overlap with each other in the thickness direction. In this case, the third bridge electrode BE3 and the fourth bridge electrode BE4_1 may be disposed on different layers from each other, such that the third bridge electrode BE3 and the fourth bridge electrode BE4_1 overlap with each other. For example, in some embodiments, the third bridge electrode BE3 may be disposed on the first conductive layer DCL1 and the fourth bridge electrode BE4_1 may be disposed on the second conductive layer DCL2, but the present disclosure is not limited thereto, and the third bridge electrode BE3 and the fourth bridge electrode BE4_1 may be disposed on any suitable ones of the conductive layers that are different from each other. As the third bridge electrode BE3 is disposed on a layer (e.g., the first conductive layer DCL1) that is different from a layer (e.g., the second conductive layer DCL2) on which the fourth bridge electrode BE4_1 is disposed, no short circuit may be created between the third and fourth bridge electrodes BE3 and BE4_1 even though they overlap with each other in the thickness direction. On the other hand, in some embodiments, the third bridge electrode BE3 may be disposed on the second conductive layer DCL2, and the fourth bridge electrode BE4_1 may be disposed on the first conductive layer DCL1.

According to this exemplary embodiment, an area occupied by the bridge electrodes when viewed from the top plan view may be reduced by disposing the bridge electrodes on different layers to overlap with each other in the thickness direction.

Although the third bridge electrode BE3 and the fourth bridge electrode BE4_1 overlap each other in the thickness direction and are disposed on different layers according to the exemplary embodiment shown in FIG. 17, it would be understood by those skilled in the art that such an overlapping structure may be implemented in a variety of suitable combinations of the various bridge electrodes. For example, as described above with reference to FIG. 16, the bridge electrodes that are disposed at (e.g., in or on) the third and fourth bridge portions MBP3 and MBP4 may be disposed on the first conductive layer DCL1, the second conductive layer DCL2, and/or the third conductive layer DCL3. Accordingly, some of the bridge electrodes that are disposed at (e.g., in or on) the third and fourth bridge portions MBP3 and MBP4 and that are disposed on different layers from among the first to third conductive layers DCL1 to DCL3 may overlap with each other in the thickness direction.

Figure 20:
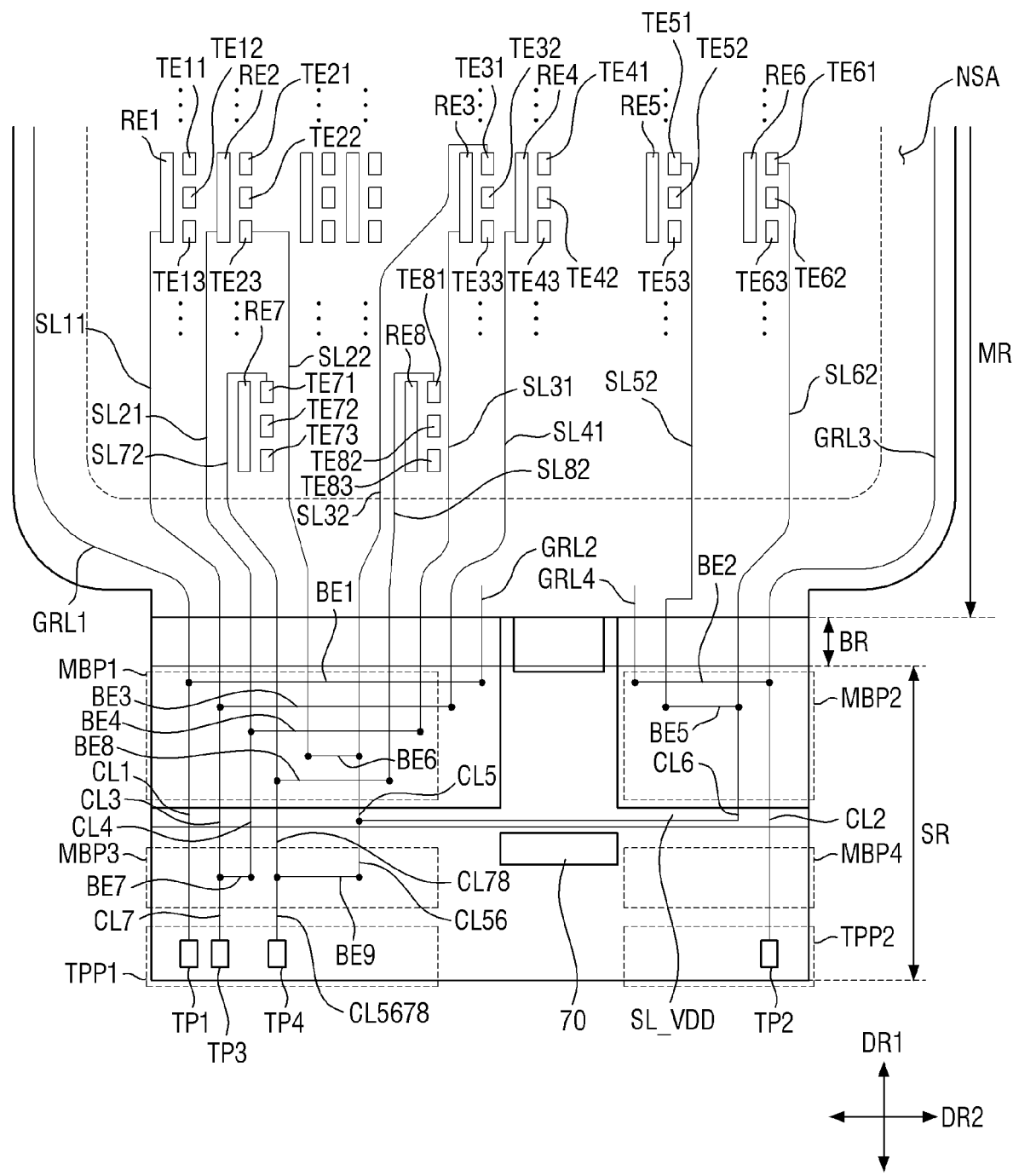
FIG. 20 is a view showing a layout of signal lines arranged at a main region, a bending region, and a subsidiary region according to yet another exemplary embodiment.

FIG. 20 is a view showing a layout of signal lines arranged in a main region, a bending region, and a subsidiary region according to yet another exemplary embodiment.

A touch member of the display device according to the exemplary embodiment shown in FIG. 20 is different from the touch member of the display device according to one or more of the above-described exemplary embodiments in that a plurality of signal lines is connected to (e.g., merged with or linked with) each other at (e.g., in or on) each of the first bridge portion MBP1 and the second bridge portion MBP2, the signal lines that are connected to (e.g., merged with or linked with) each other at (e.g., in or on) the second bridge portion MBP2 are connected to (e.g., merged with or linked with) the signal lines that are connected to (or merged with) each other at (e.g., in or on) the first bridge portion MBP1, and the signal lines may again be connected to (e.g., merged with or linked with) other lines at (e.g., in or on) the third bridge portion MBP3.

In more detail, the sensing electrodes RE may further include seventh and eighth sensing electrodes RE7 and RE8, and the driving electrodes TE may further include seventh-first to seventh-third driving electrodes TE71 to TE73 that are associated with the seventh sensing electrode RE7, and eighth-first to eighth-third driving electrodes TE81 to TE83 that are associated with the eighth sensing electrode RE8. A seventh-first touch driving signal line SL72 may be connected to the seventh-first driving electrode TE71, and an eighth-first touch driving signal line SL82 may be connected to the eighth-first driving electrode TE81.

Each of the seventh-first touch driving signal line SL72 and the eighth-first touch driving signal line SL82 may extend (e.g., pass) through the first bridge portion MBP1 and the third bridge portion MBP3 at (e.g., in or on) the subsidiary region SR.

Each of the seventh-first touch driving signal line SL72 and the eighth-first touch driving signal line SL82 may extend in the first direction DR1. Each of the seventh-first touch driving signal line SL72 and the eighth-first touch driving signal line SL82 may extend (e.g., pass) through the bending region BR to the first bridge portion MBP1. The seventh-first touch driving signal line SL72 and the eighth-first touch driving signal line SL82 may be electrically connected (e.g., electrically merged or electrically linked) with each other through the eighth bridge electrode BE8 at (e.g., in or on) the first bridge portion MBP1. The eighth bridge electrode BE8 may be disposed on the first conductive layer DCL1 described above with reference to FIG. 4. A seventy-eighth connection line CL78 that is connected to the eighth bridge electrode BE8 may extend in the first direction DR1. The seventy-eighth connection line CL78 may be electrically connected to each of the seventh-first touch driving signal line SL72 and the eighth-first touch driving signal line SL82. The seventy-eighth connection line CL78 may be positioned at (e.g., on) an opposite side of the eighth bridge electrode BE8 with respect to the seventh-first touch driving signal line SL72 and the eighth-first touch driving signal line SL82, with the eighth bridge electrode BE8 interposed therebetween.

The sixth connection line CL6 may be electrically connected to the fifth connection line CL5. The sixth connection line CL6 may be directly connected to the fifth connection line CL5 without any bridge electrodes. The fifty-sixth connection line CL56, which is formed by connecting (e.g., merging) the fifth connection line CL5 and the sixth connection line CL6, may extend in the first direction DR1 and may be electrically connected to (e.g., electrically merged with or electrically linked with) the seventy-eighth connection line CL78 through a ninth bridge electrode BE9 at (e.g., in or on) the third bridge portion MBP3.

According to one or more of the exemplary embodiments of the present disclosure, the bridge portions at (e.g., in or on) which the bridge electrodes are disposed may also include portions where the touch signal lines are first connected (e.g., merged or linked) with each other, for example, such as at the first bridge portion and/or at the second bridge portion, and portions where the connected (e.g., merged or linked) touch signal lines are again connected (e.g., merged or linked) with each other or with other signal lines, for example, such as at the third bridge portion and/or at the fourth bridge portion. Accordingly, the number of touch pads may be reduced (e.g., significantly reduced).

In addition, the touch signal lines that are connected (e.g., merged or linked) with each other or with other signal lines at (e.g., in or on) the first bridge portion MBP1 that is positioned on one side of the driving chip 70 in the second direction DR2 and the touch signal lines that are connected (e.g., merged or linked) with each other or with other signal lines at (e.g., in or on) the second bridge portion MBP2 that is positioned on the opposite side of the driving chip 70 in the second direction DR2 may extend to the third bridge portion MBP3 to be connected (e.g., merged or linked) with each other. Accordingly, the number of the touch pads may be further reduced. As a result, a sufficient area where the driving chip 70 is to be mounted on the display panel 20 may be provided. In addition, a dead space may be reduced in the touch pad unit.

Figure 21:
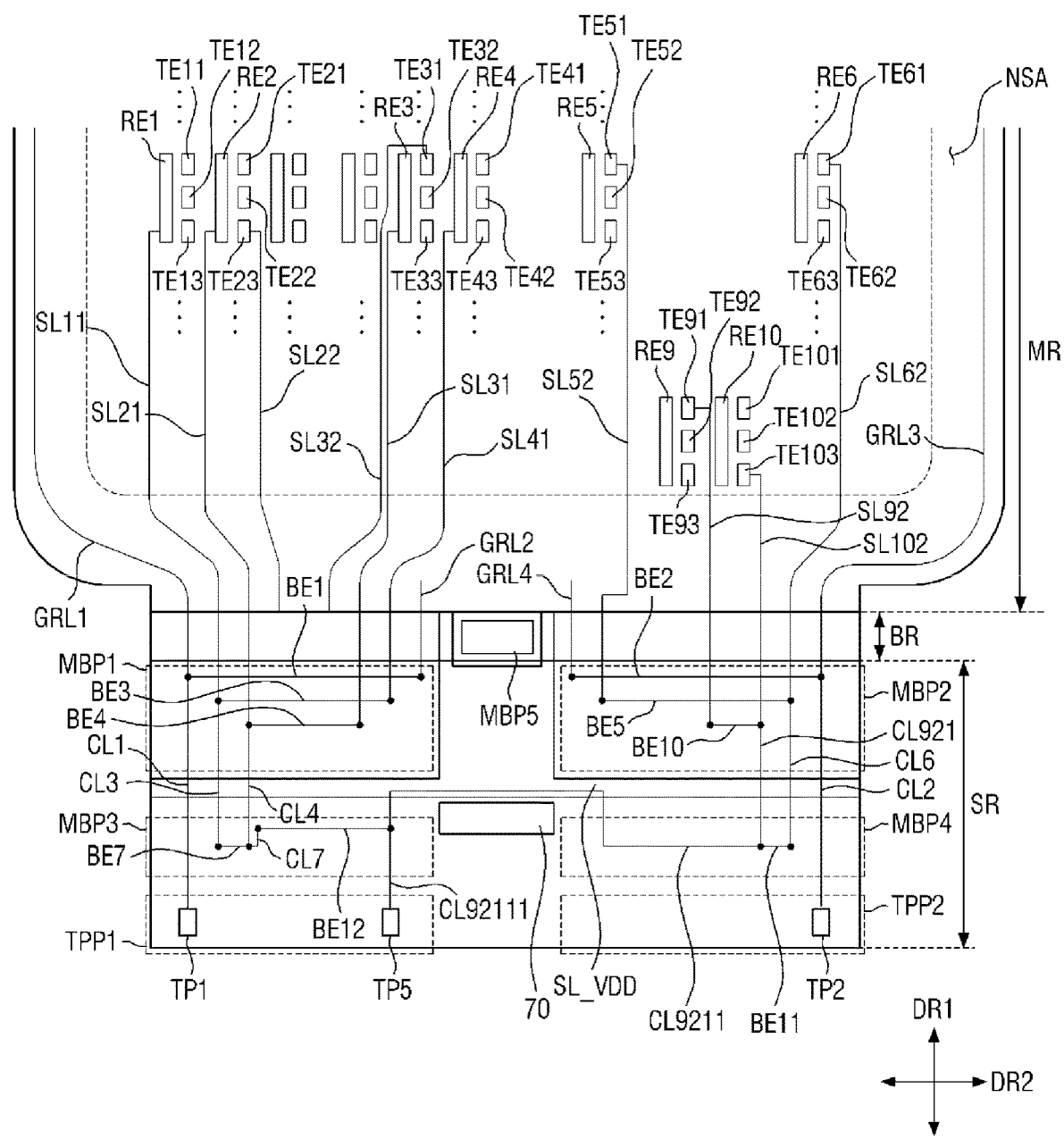
FIG. 21 is a view showing a layout of signal lines arranged in a main region, a bending region, and a subsidiary region according to yet another exemplary embodiment.

FIG. 21 is a view showing a layout of signal lines arranged in a main region, a bending region, and a subsidiary region according to yet another exemplary embodiment.

A touch member of the display device according to the exemplary embodiment shown in FIG. 21 is different from the touch member of the display device according to one or more of the above-described exemplary embodiments in that the signal lines that are connected (e.g., merged or linked) in the first bridge portion MBP1 and the third bridge portion MBP3 and the signal lines that are connected (e.g., merged or linked) in the second bridge portion MBP2 and the fourth bridge portion MBP4 may again be connected (e.g., merged or linked) with each other or with other signal lines at (e.g., in or on) the third bridge portion MBP3.

In more detail, in the touch member of the display device according to this exemplary embodiment, the signal lines that are connected (e.g., merged or linked) with each other at (e.g., in or on) the first bridge portion MBP1 and the third bridge portion MBP3 may again be connected (e.g., merged or linked) with the signal lines that are connected (e.g., merged or linked) with each other at (e.g., in or on) the second bridge portion MBP2 and the fourth bridge portion MBP4 at (e.g., in or on) the third bridge portion MBP3. For example, the sensing electrodes RE may further include ninth and tenth sensing electrodes RE9 and RE10, and the driving electrodes TE may further include ninth-first to ninth-third driving electrodes TE91 to TE93 that are associated with the ninth sensing electrode RE9, and tenth-first to tenth-third driving electrodes TE101 to TE103 that are associated with the tenth sensing electrode RE10. A ninth-second touch driving signal line SL92 may be connected to the ninth-first driving electrode TE91, and a tenth-second touch driving signal line SL102 may be connected to the tenth-third driving electrode TE103.

Each of the ninth-second touch driving signal line SL92 and the tenth-second touch driving signal line SL102 may extend (e.g., pass) through the second bridge portion MBP2 and the fourth bridge portion MBP4 in the subsidiary region SR.

The ninth-second touch driving signal line SL92 and the tenth-second touch driving signal line SL102 may be electrically connected (e.g., electrically merged or electrically linked) with each other through a tenth bridge electrode BE10 at (e.g., in or on) the second bridge portion MBP2. A nine-hundred-twenty-first connection line CL921 that is electrically connected to the tenth bridge electrode BE10 may be electrically connected to each of the ninth-second touch driving signal line SL92 and the tenth-second touch driving signal line SL102. The nine-hundred-twenty-first connection line CL921 may be electrically connected to (e.g., merged with or linked with) the sixth connection line CL6 described above through an eleventh bridge electrode BE11 at (e.g., in or on) the fourth bridge portion MBP4. A ninety-two-eleventh connection line CL9211 that is electrically connected to the eleventh bridge electrode BE11 may extend to the third bridge portion MBP3 and may be electrically connected to (e.g., merged with or linked with) the seventh connection line CL7 described above through a twelfth bridge electrode BE12. A nine-hundred-twenty-one-eleventh connection line CL92111 that is electrically connected to the twelfth bridge electrode BE12 may be connected to a fifth touch pad TP5 that is disposed at (e.g., in or on) the first pad portion TPP1.

Figure 22:
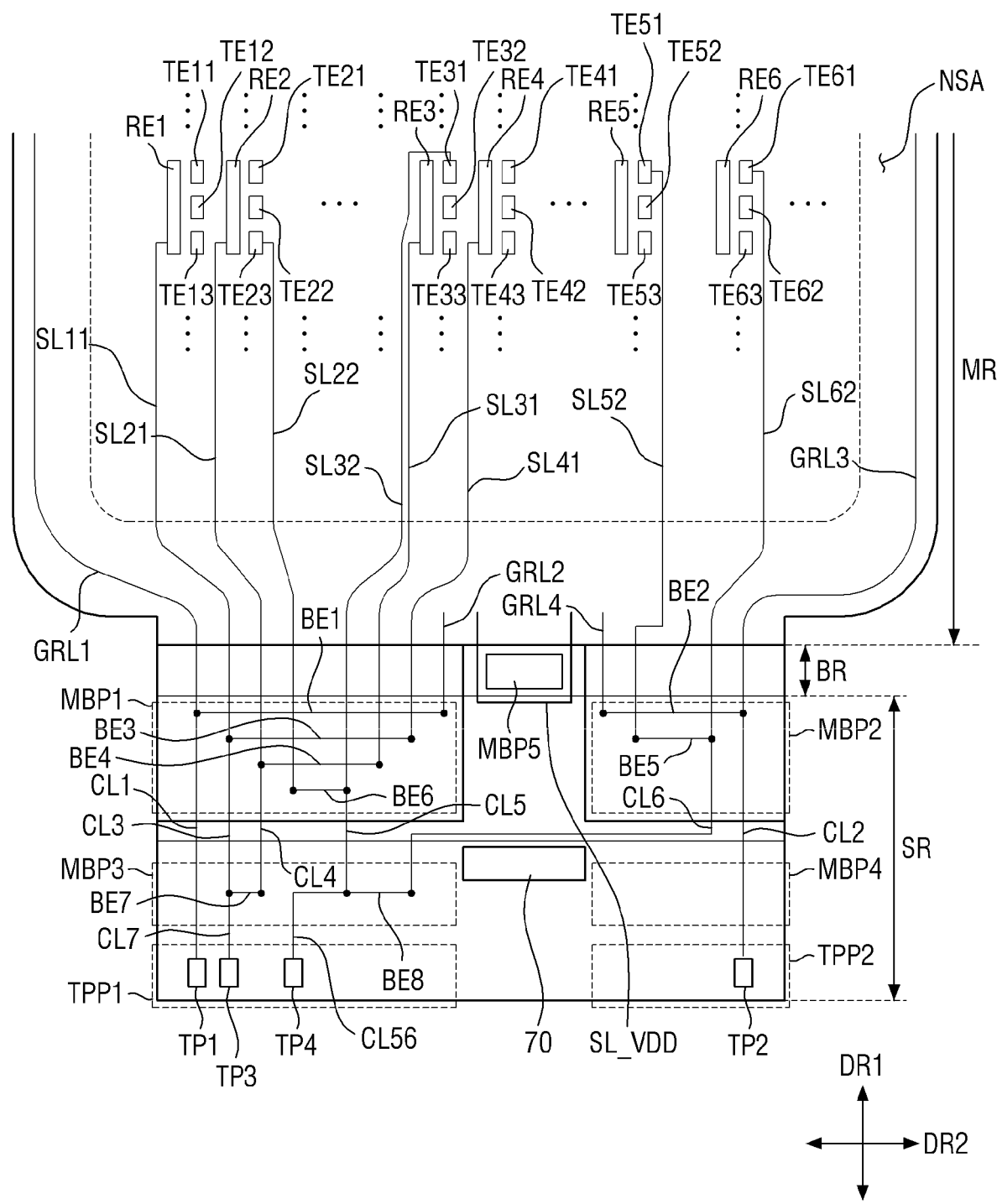
FIG. 22 is a view showing a layout of signal lines arranged in a main region, a bending region, and a subsidiary region according to yet another exemplary embodiment.

FIG. 22 is a view showing a layout of signal lines arranged in a main region, a bending region, and a subsidiary region according to yet another exemplary embodiment.

A touch member of a display device according to the exemplary embodiment shown in FIG. 22 is different from the touch member of the display device according to one or more of the above-described exemplary embodiments in that a fifth bridge portion MBP5 is further disposed between the supply voltage line SL_VDD and connection parts that extend (e.g., pass) through the main region MR.

The fifth bridge portion MBP5 may perform the same or substantially the same functions as those of the first bridge portion MBP1 or the second bridge portion MBP2 described above. The other elements are the same or substantially the same as to those described above, and thus, redundant description thereof may not be repeated.

Figure 23:
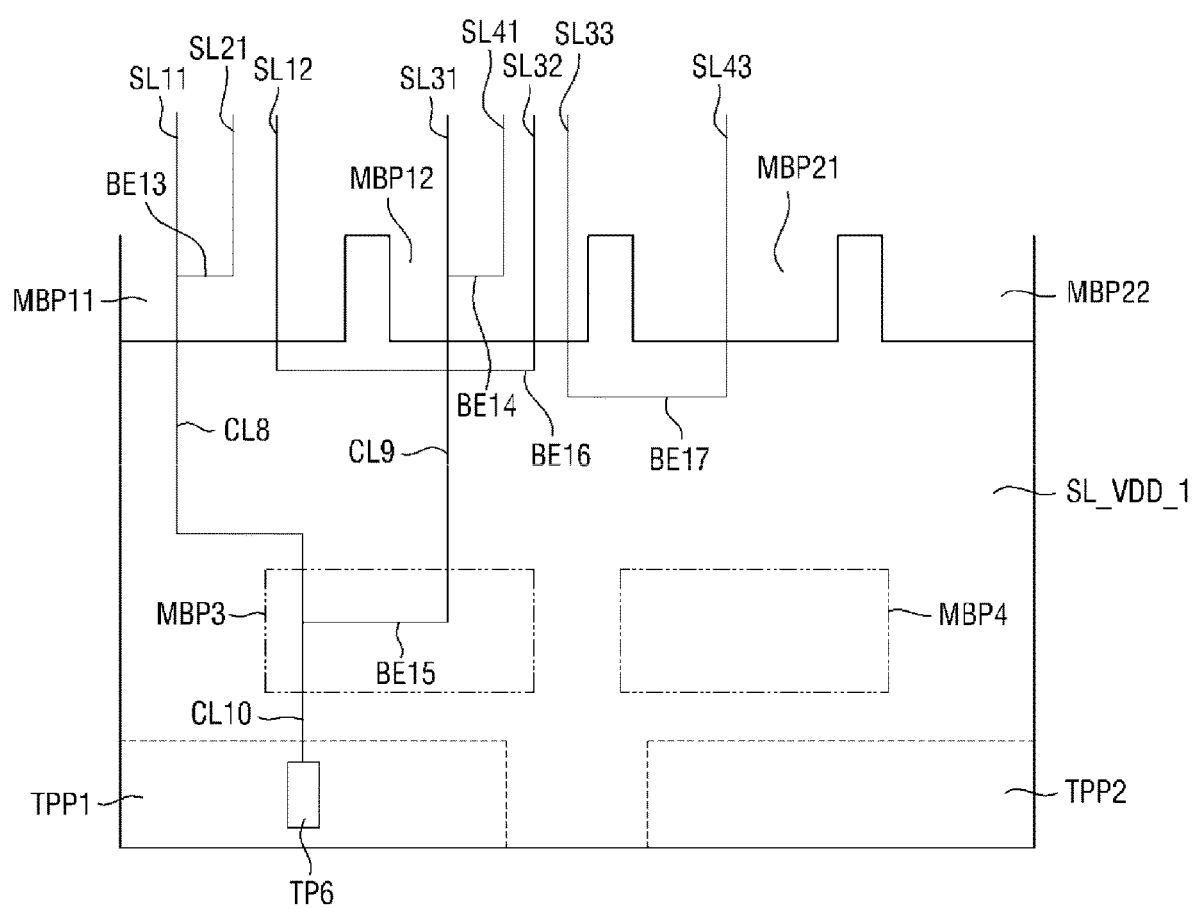
FIG. 23 is a view showing a layout of signal lines arranged in a subsidiary region according to yet another exemplary embodiment.

FIG. 23 is a view showing a layout of signal lines arranged in a subsidiary region according to yet another exemplary embodiment.

A touch member of a display device according to the exemplary embodiment shown in FIG. 23 is different from the touch member of the display device according to one or more of the above-described exemplary embodiments in that the first bridge portion MBP1 may be divided by a supply voltage line SL_VDD_1.

In more detail, in the touch member of the display device according to this exemplary embodiment, the first bridge portion MBP1 may be divided by the supply voltage line SL_VDD_1.

The first bridge portion MBP1 may be divided by the supply voltage line SL_VDD_1 into a first sub-bridge portion MBP11 and a second sub-bridge portion MBP12, and the second bridge portion MBP2 may be divided by the supply voltage line SL_VDD_1 into a third sub-bridge portion MBP21 and a fourth sub-bridge portion MBP22. The second sub-bridge portion MBP12 may be disposed between the first sub-bridge portion MBP11 and the third sub-bridge portion MBP21, and the third sub-bridge portion MBP21 may be disposed between the second sub-bridge portion MBP12 and the fourth sub-bridge portion MBP22.

According to the exemplary embodiment shown in FIG. 23, the first touch sensing signal line SL11 and the second touch sensing signal line SL21 may be electrically connected to (e.g., merged with or linked with) each other by a thirteenth bridge electrode BE13 at (e.g., in or on) the first sub-bridge portion MBP11. The third touch sensing signal line SL31 and the fourth touch sensing signal line SL41 may be electrically connected to (e.g., merged with or linked with) each other by a fourteenth bridge electrode BE14 at (e.g., in or on) the second sub-bridge area MBP12. Each of the first touch sensing signal line SL11 and the second touch sensing signal line SL21 that are electrically connected to (e.g., merged with or linked with) each other by the thirteenth bridge electrode BE13 may be electrically connected to the eighth connection line CL8. Each of the third touch sensing signal line SL31 and the fourth touch sensing signal line SL41 that are electrically connected to (e.g., merged with or linked with) each other by the fourteenth bridge electrode BE14 may be electrically connected to the ninth connection line CL9.

The eighth connection line CL8 and the ninth connection line CL9 may be electrically connected to (e.g., merged with or linked with) each other by a fifteenth bridge electrode BE15 at (e.g., in or on) the third bridge portion MBP3. Each of the eighth connection line CL8 and the ninth connection line CL9, which are electrically connected to (e.g., merged with or linked with) each other by the fifteenth bridge electrode BE15 may be connected to a sixth touch pad TP6 (e.g., via a tenth connection line CL10).

In addition, the first-second touch driving signal line SL12 and the third-second touch driving signal line SL32 may extend in (e.g., extend across) the first and second sub-bridge portions MBP11 and MBP12, respectively, and the first-second touch driving signal line SL12 and the third-second touch driving signal line SL32 may be electrically connected to (e.g., merged with or linked with) each other through a sixteenth bridge electrode BE16 between the third bridge portion MBP3 and the first and second sub-bridge portions MBP11 and MBP12.

In addition, the third-third touch driving signal line SL33 and the fourth-third touch driving signal line SL43 may extend in (e.g., extend across) the second and third sub-bridge portions MBP12 and MBP21, respectively, and the third-third touch driving signal line SL33 and the fourth-third touch driving signal line SL43 may be electrically connected to (e.g., merged with or linked with) each other through a seventeenth bridge electrode BE17 between the fourth bridge portion MBP4 and the second and third sub-bridge portions MBP12 and MBP21.

Figure 24:
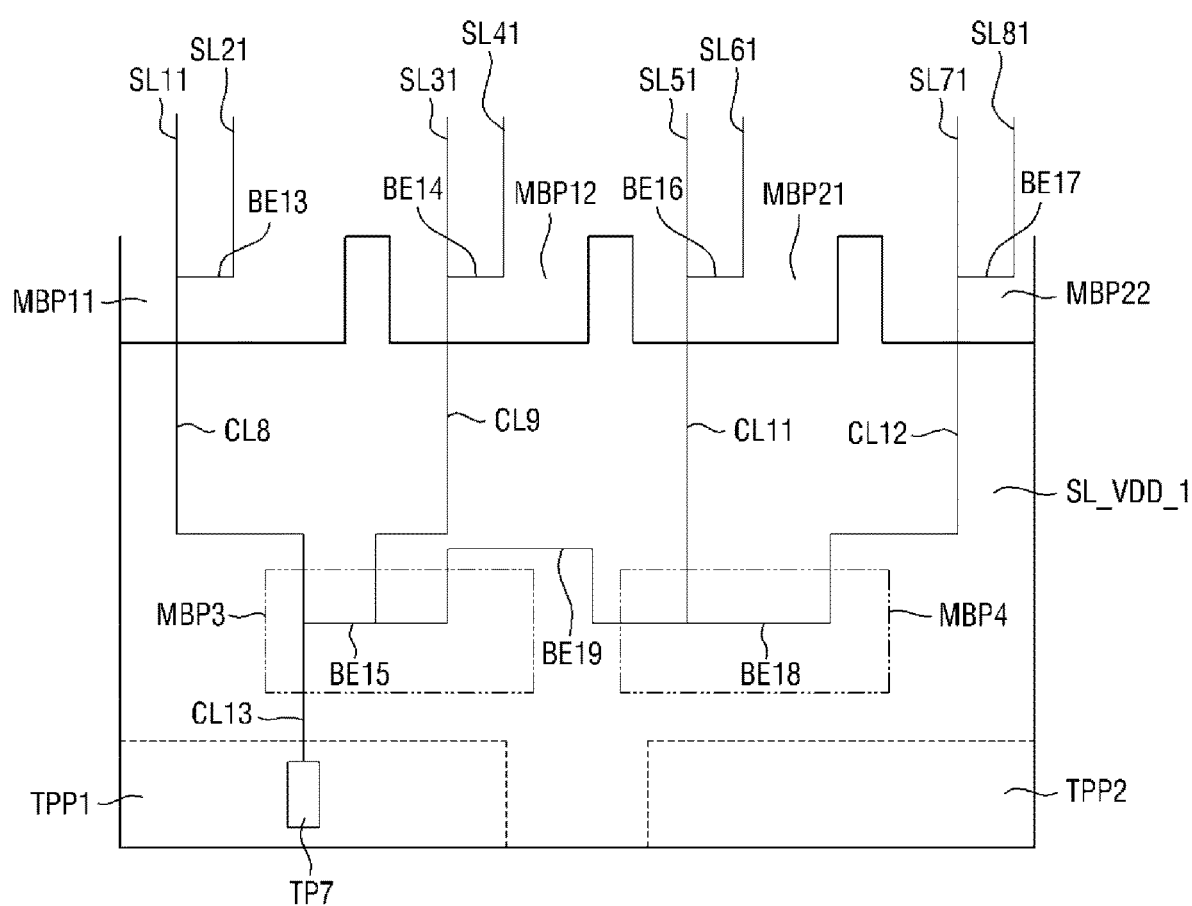
FIG. 24 is a view showing a layout of signal lines arranged in a subsidiary region according to yet another exemplary embodiment.

FIG. 24 is a view showing a layout of signal lines arranged in a subsidiary region according to yet another exemplary embodiment.

Referring to FIG. 24, the fifth touch sensing signal line SL51 and the sixth touch sensing signal line SL61 may be electrically connected to (e.g., merged with or linked with) each other by a sixteenth bridge electrode BE16 at (e.g., in or on) the third sub-bridge portion MBP21. The seventh touch sensing signal line SL71 and the eighth touch sensing signal line SL81 may be electrically connected to (or merged with or linked with) each other by a seventeenth bridge electrode BE17 at (e.g., in or on) the fourth sub-bridge area MBP22. Each of the fifth touch sensing signal line SL51 and the sixth touch sensing signal line SL61 that are electrically connected to (e.g., merged with or linked with) each other by the sixteenth bridge electrode BE16 may be electrically connected to the eleventh connection line CL11. Each of the seventh touch sensing signal line SL71 and the eighth touch sensing signal line SL81 that are electrically connected to (e.g., merged with or linked with) each other by the seventeenth bridge electrode BE17 may be electrically connected to the twelfth connection line CL12.

The eleventh connection line CL11 and the twelfth connection line CL12 may be electrically connected to (e.g., merged with or linked with) each other by the eighteenth bridge electrode BE18 at (e.g., in or on) the fourth bridge portion MBP4. In addition, the eleventh and twelfth connection lines CL11 and CL12 that are electrically connected to (e.g., merged with or linked with) each other by the eighteenth bridge electrode BE18 and the eighth and ninth connection lines CL8 and CL9 that are electrically connected to (e.g., merged with or linked with) each other by the fifteenth bridge electrode BE15 may be electrically connected to (e.g., merged with or linked with) each other by a nineteenth bridge electrode BE19.

Each of the eleventh and twelfth connection lines CL11 and CL12 that are electrically connected to (e.g., merged with or linked with) each other by the eighteenth bridge electrode BE18 and electrically connected to (e.g., merged or linked with) the nineteenth bridge electrode BE19, and each of the eighth and ninth connection lines CL8 and CL9 that are electrically connected to (e.g., merged or linked with) each other by the fifteenth bridge electrode BE15, may be connected to a seventh touch pad TP7.

Although various embodiments of the invention have been described for illustrative purposes, those skilled in the art will appreciate that various modifications, additions, and/or substitutions are possible, without departing from the scope and spirit of the invention as disclosed in the accompanying claims, and their equivalents.

What is claimed is:

1. A display device comprising:
   a base substrate having a main region, a subsidiary region, and a bending region between the main region and the subsidiary region;
   first, second, third, and fourth touch electrodes on the base substrate at the main region;
   first, second, third, and fourth touch signal lines connected to the first, second, third, and fourth touch electrodes on the base substrate;
   a first bridge electrode electrically connecting the first touch signal line with the second touch signal line;
   a second bridge electrode electrically connecting the third touch signal line with the fourth touch signal line;
   a first touch connection electrode electrically connected to the first bridge electrode;
   a second touch connection electrode electrically connected to the second bridge electrode; and
   a third bridge electrode connecting the first touch connection electrode with the second touch connection electrode,
   wherein the subsidiary region comprises a first bridge portion, and a second bridge portion that is located farther from the main region than the first bridge portion in a first direction, and
   wherein each of the first bridge electrode and the second bridge electrode is at the first bridge portion, and the third bridge electrode is at the second bridge portion.

2. The display device of claim 1, wherein the subsidiary region further comprises a pad portion comprising a pad,
   wherein the pad portion is located farther from the main region than the second bridge portion in the first direction, and
   wherein a third touch connection electrode is connected to the third bridge electrode and to the pad.

3. The display device of claim 1, wherein the first touch signal line comprises:
   the first touch connection electrode at the main region;
   a source connection electrode at the bending region and the first bridge portion; and
   the second touch connection electrode at the second bridge portion and on a same layer as that of the first touch connection electrode, and
   wherein the first touch connection electrode and the second touch connection electrode are at a different layer from that of the source connection electrode.

4. The display device of claim 3, wherein the first touch connection electrode is connected to the source connection electrode through a first contact hole,
   wherein the second touch connection electrode is connected to the source connection electrode through a second contact hole, and
   wherein the first contact hole is closer to the main region than the second contact hole in a second direction opposite to the first direction.

5. The display device of claim 4, wherein the source connection electrode is connected to the first bridge electrode through a third contact hole at the first bridge portion, and
   wherein the third contact hole is farther from the main region than the first contact hole in the first direction, and is closer to the main region than the second contact hole in the second direction.

6. The display device of claim 5, wherein the second touch connection electrode is connected to the third bridge electrode through a fourth contact hole at the second bridge portion, and
   wherein the fourth contact hole is farther from the main region than the second contact hole in the first direction.

7. The display device of claim 1, wherein the first touch electrode to the fourth touch electrode are driving electrodes, and
   wherein the first touch signal line to the fourth touch signal line are driving touch signal lines configured to provide driving signals to the driving electrodes.

8. The display device of claim 1, wherein the first touch electrode to the fourth touch electrode are sensing electrodes, and
   wherein the first touch signal line to the fourth touch signal line are touch sensing signal lines configured to transmit sensing signals from the sensing electrodes.

9. The display device of claim 1, wherein the first bridge electrode and the second bridge electrode overlap with each other in a thickness direction that crosses the first direction, and the first bridge electrode and the second bridge electrode are disposed at different layers from each other.

10. The display device of claim 1, further comprising:
    a driving integrated circuit at the subsidiary region on the base substrate; and
    a supply voltage line connected to the driving integrated circuit,
    wherein the first bridge portion comprises:
    a first sub-bridge portion; and
    a second sub-bridge portion spaced from the first sub-bridge portion with the supply voltage line between the first and second sub-bridge portions.

11. The display device of claim 10, wherein the first touch signal line and the second touch signal line are at the first sub-bridge portion,
    wherein the third touch signal line and the fourth touch signal line are at the second sub-bridge portion, and wherein the second touch connection electrode overlaps with the supply voltage line in a thickness direction that crosses the first direction.

12. The display device of claim 10, further comprising:
a fifth touch electrode;
a sixth touch electrode;
a fifth touch signal line connected to the fifth touch electrode; and
a sixth touch signal line connected to the sixth touch electrode,
wherein the first touch signal line to the fourth touch signal line are at the first sub-bridge portion,
wherein the fifth touch signal line and the sixth touch signal line are at the second sub-bridge portion, and
wherein the display device further comprises a fourth bridge electrode electrically connecting the fifth touch signal line with the sixth touch signal line at the second sub-bridge portion.

13. The display device of claim 12, further comprising a third touch connection electrode connected to the fourth bridge electrode,
wherein the third touch connection electrode is directly connected to the second touch connection electrode at the first bridge portion.

14. The display device of claim 12, further comprising:
a seventh touch electrode;
an eighth touch electrode;
a seventh touch signal line electrically connected to the seventh touch electrode; and
an eighth touch signal line electrically connected to the eighth touch electrode,
wherein the seventh touch signal line and the eighth touch signal line are at the second sub-bridge portion, and
wherein the display device further comprises a fifth bridge electrode electrically connecting the seventh touch signal line with the eighth touch signal line at the second sub-bridge portion.

15. The display device of claim 14, further comprising:
a third touch connection electrode electrically connected to the fourth bridge electrode;
a fourth touch connection electrode electrically connected to the fifth bridge electrode; and
a fifth touch connection electrode electrically connected to a sixth bridge electrode,
wherein the third touch connection electrode and the fourth touch connection electrode are electrically connected to each other through the sixth bridge electrode at the second bridge portion, and
wherein the fifth touch connection electrode and the third touch connection electrode are electrically connected to each other through a seventh bridge electrode.

16. The display device of claim 10, wherein the first bridge portion further comprises a third sub-bridge portion between connection parts of the supply voltage line.

17. A display device comprising:
a base substrate having a main region, a subsidiary region, and a bending region between the main region and the subsidiary region;
a first conductive layer on the base substrate;
a first insulating layer on the first conductive layer;
a second conductive layer on the first insulating layer;
a second insulating layer on the second conductive layer;
a third conductive layer on the second insulating layer;
a third insulating layer on the third conductive layer;
a fourth conductive layer on the third insulating layer, the fourth conductive layer comprising:
first, second, third, and fourth touch electrodes at the main region; and
first, second, third, and fourth touch signal lines electrically connected to the first, second, third, and fourth touch electrodes;
a first touch connection electrode electrically connected to a first bridge electrode; and
a second touch connection electrode electrically connected to a second bridge electrode,
wherein the first conductive layer or the second conductive layer comprises:
the first bridge electrode electrically connecting the first touch signal line with the second touch signal line;
the second bridge electrode electrically connecting the third touch signal line with the fourth touch signal line; and
a third bridge electrode electrically connecting the first touch connection electrode with the second touch connection electrode.

18. The display device of claim 17, wherein the subsidiary region comprises a first bridge portion and a second bridge portion, the second bridge portion being farther from the main region than the first bridge portion in a first direction,
wherein the first bridge electrode and the second bridge electrode are at the first bridge portion, and
wherein the third bridge electrode is at the second bridge portion.

19. The display device of claim 18, wherein the first touch signal line comprises:
the first touch connection electrode at the main region;
a source connection electrode at each of the bending region and the first bridge portion; and
the second touch connection electrode at the second bridge portion, the second touch connection electrode being at a same layer as that of the first touch connection electrode, and
wherein the first touch connection electrode and the second touch connection electrode are at a different layer from that of the source connection electrode.

20. The display device of claim 19, wherein the fourth conductive layer further comprises the first touch connection electrode and the second touch connection electrode, and
wherein the third conductive layer further comprises the source connection electrode.

21. The display device of claim 17, further comprising an encapsulation layer on the third conductive layer and the third insulating layer,
wherein the third insulating layer is directly on the encapsulation layer.

22. The display device of claim 17, wherein the first bridge electrode and the second bridge electrode overlap with each other in a thickness direction, and the first bridge electrode and the second bridge electrode are at different layers from each other.

* * * * *